(12) United States Patent
Im et al.

(10) Patent No.: US 12,237,364 B2
(45) Date of Patent: Feb. 25, 2025

(54) DISPLAY DEVICE

(71) Applicant: Samsung Display Co., LTD., Yongin-si (KR)

(72) Inventors: Hyun Deok Im, Seoul (KR); Buem Joon Kim, Hwaseong-si (KR); Won Ho Lee, Suwon-si (KR); Hae Yun Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 463 days.

(21) Appl. No.: 17/747,602

(22) Filed: May 18, 2022

(65) Prior Publication Data

US 2022/0415965 A1 Dec. 29, 2022

(30) Foreign Application Priority Data

Jun. 25, 2021 (KR) .................. 10-2021-0083014

(51) Int. Cl.
*H01L 27/15* (2006.01)
*H01L 33/38* (2010.01)

(52) U.S. Cl.
CPC .......... *H01L 27/156* (2013.01); *H01L 33/382* (2013.01)

(58) Field of Classification Search
CPC ..... H01L 27/156; H01L 33/382; H01L 33/62; H01L 25/0753; H01L 27/124; H01L 27/1248; H01L 33/483
See application file for complete search history.

(56) References Cited

U.S. PATENT DOCUMENTS

| 2020/0144336 | A1* | 5/2020 | Xiong ................. H01L 27/1248 |
| 2021/0167147 | A1 | 6/2021 | Nakatani et al. |
| 2021/0193761 | A1* | 6/2021 | Gee ...................... H10K 59/123 |
| 2021/0217739 | A1 | 7/2021 | Lee et al. |
| 2021/0343783 | A1 | 11/2021 | Choi et al. |
| 2022/0028922 | A1* | 1/2022 | Park ....................... H01L 33/382 |
| 2022/0068901 | A1 | 3/2022 | Kong et al. |

FOREIGN PATENT DOCUMENTS

| JP | 2021-086769 A | 6/2021 |
| KR | 10-2015-0006798 A | 1/2015 |
| KR | 10-2020-0027136 A | 3/2020 |
| KR | 10-2020-0038389 A | 4/2020 |
| KR | 10-2020-0073340 A | 6/2020 |

* cited by examiner

*Primary Examiner* — Kyoung Lee
*Assistant Examiner* — Sophia W Kao
(74) *Attorney, Agent, or Firm* — Lewis Roca Rothgerber Christie LLP

(57) ABSTRACT

A display device includes: a first sub-pixel having a first emission area and a first sub-area adjacent to each other in a first direction; and a bank extending around a portion of the first emission area and the first sub-area. The bank includes: a first wall extending around the first sub-area; and a second wall adjacent to the first emission area in a second direction crossing the first direction. The second wall and the first wall are spaced apart from each other in the first direction.

20 Claims, 21 Drawing Sheets

DISPLAY DEVICE

CROSS-REFERENCE TO RELATED APPLICATION

This application claims priority to and the benefit of Korean Patent Application No. 10-2021-0083014, filed on Jun. 25, 2021, in the Korean Intellectual Property Office, the content of which is herein incorporated by reference in its entirety.

BACKGROUND

1. Field

Aspects of embodiments of the present disclosure relate to a display device.

2. Description of the Related Art

Display devices have become increasingly important with the development of multimedia. Accordingly, various types of display devices, such as an organic light emitting diode (OLED) display and a liquid crystal display (LCD) have been developed.

Display devices are devices for displaying images and include display panels, such as organic light emitting diode display panels or liquid crystal display panels. The display panel may include a light emitting element, which may be a light emitting diode (LED). Examples of the light emitting diode include an organic light emitting diode (OLED) that includes (or uses) an organic material as a light emitting material, an inorganic light emitting diode that includes (or uses) an inorganic material as a light emitting material, and the like.

SUMMARY

Embodiments of the present disclosure provide a display device in which an alignment degree of light emitting elements is improved by adjusting a surface shape of ink deposited (e.g., jetted) into emission areas by using a shape of a first bank acting as a wall in an inkjet process for aligning the light emitting elements.

However, aspects and features of the present disclosure are not limited to those set forth herein. The above and other aspects and features of the present disclosure will become more apparent to one of ordinary skill in the art to which the present disclosure pertains by referencing the detailed description of the present disclosure given below.

According to an embodiment of the present disclosure, a display device includes: a first sub-pixel having a first emission area and a first sub-area adjacent to each other in a first direction; and a bank extending around a portion of the first emission area and the first sub-area. The bank includes: a first wall extending around the first sub-area; and a second wall adjacent to the first emission area in a second direction crossing the first direction. The second wall and the first wall are spaced apart from each other in the first direction.

The display device may further include a first electrode and a second electrode over the first emission area and the first sub-area, extending in the first direction, and spaced apart from each other in the second direction, and a plurality of light emitting elements between the first electrode and the second electrode in the first emission area.

The bank may be on the first electrode and the second electrode.

The first electrode and the second electrode may extend in the first direction in the first emission area and may terminate in the first sub-area.

The bank may include a hydrophobic material.

The display device may further include a second sub-pixel adjacent to the first sub-pixel in the second direction and having a second emission area and a second sub-area adjacent to each other in the first direction. The second sub-area may be spaced apart from the first emission area in the second direction with the second wall therebetween.

The second wall may extend around the second sub-area.

The display device may further include a third sub-pixel adjacent to the second sub-pixel in the second direction and having a third emission area and a third sub-area adjacent to each other in the first direction. The third emission area may be spaced apart from the second sub-area in the second direction with the second wall therebetween.

The bank further may include a third wall extending around the third sub-area, and the third wall and the second wall may be spaced apart from each other in the first direction.

The second emission area may be spaced apart from the first sub-area in the second direction with the first wall therebetween and may be spaced apart from the third sub-area in the second direction with the third wall therebetween.

The display device may further include a second sub-pixel adjacent to the first sub-pixel in the second direction and having a second emission area and a second sub-area adjacent to each other in the first direction. The second emission area may be spaced apart from the first emission area in the second direction with the second wall therebetween.

The second sub-area may be adjacent to the first sub-area in the second direction, and the bank may further include a third wall extending around the second sub-area.

The first wall and the third wall may be integrated with each other to form one pattern.

The second wall and the third wall may be spaced apart from each other in the first direction.

The display device may further include a second sub-pixel adjacent to the first sub-pixel in the first direction and having a second emission area and a second sub-area adjacent to each other in the first direction. The bank may further include a third wall extending around the second sub-area, and a distance between the first wall and the third wall in the first direction may be greater than a length of the second wall in the first direction.

An interval between the first wall and the second wall in the first direction may be smaller than the length of the second wall in the first direction.

According to another embodiment of the present disclosure, a display device includes: a first emission area; a first sub-area on one side of the first emission area in a first direction; a second sub-area on another side of the first emission area in the first direction; a third sub-area on one side of the first emission area in a second direction crossing the first direction; a first wall extending around the first sub-area; a second wall extending around the second sub-area; and a third wall extending around the third sub-area. The third wall is spaced apart from the second wall in the first direction and is integrated with the first wall.

The display device may further include a first electrode and a second electrode over the first emission area, the first sub-area, and the second sub-area, extending in the first direction, and spaced apart from each other in the second direction, and a plurality of light emitting elements between the first electrode and the second electrode in the first emission area.

The first electrode and the second electrode may extend in the first direction in the first emission area and may terminate in the first sub-area and the second sub-area.

The display device may further include a second emission area on another side of the third sub-area in the first direction. The second emission area may be on one side of the second sub-area in the second direction, and a passage defined as an area between the second wall and the third wall may be formed between the first emission area and the second emission area.

Detailed descriptions of other aspects and other embodiments are described in a detailed description and are illustrated in the drawings.

In the display device according to an embodiment, an alignment degree of light emitting elements may be improved by adjusting a surface shape of ink deposited into emission areas by using a shape of a first bank, which acts as a wall in an inkjet process for aligning the light emitting elements. For example, the display device may have an emission area and a sub-area adjacent to each other in the first direction and may include a plurality of electrodes extending in the first direction and crossing the emission area and the sub-area on the first bank. The first bank may extend around the sub-area and the emission area, but a passage may be formed to expose an upper area or a lower area of the emission area. Accordingly, during the inkjet process for aligning the light emitting elements, the ink deposited (or jetted) into the emission area is induced to flow from one emission area to the other emission areas through the passage, such that a surface shape of the ink in the emission area may be flat even at an upper side and a lower side of the emission area. Accordingly, a flow of the ink that may otherwise be caused by the surface shape of the ink may be prevented or substantially prevented to prevent or substantially prevent the light emitting elements aligned during the process for aligning the light emitting elements from being collected upward and downward in the emission areas due to the shape of the ink. Therefore, an alignment degree of the light emitting elements aligned between the plurality of electrodes in the emission area may be improved, thereby improving a display quality of the display device.

The aspects and features of the present disclosure are not limited to those mentioned above, and various other aspects and features are included in the specification.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
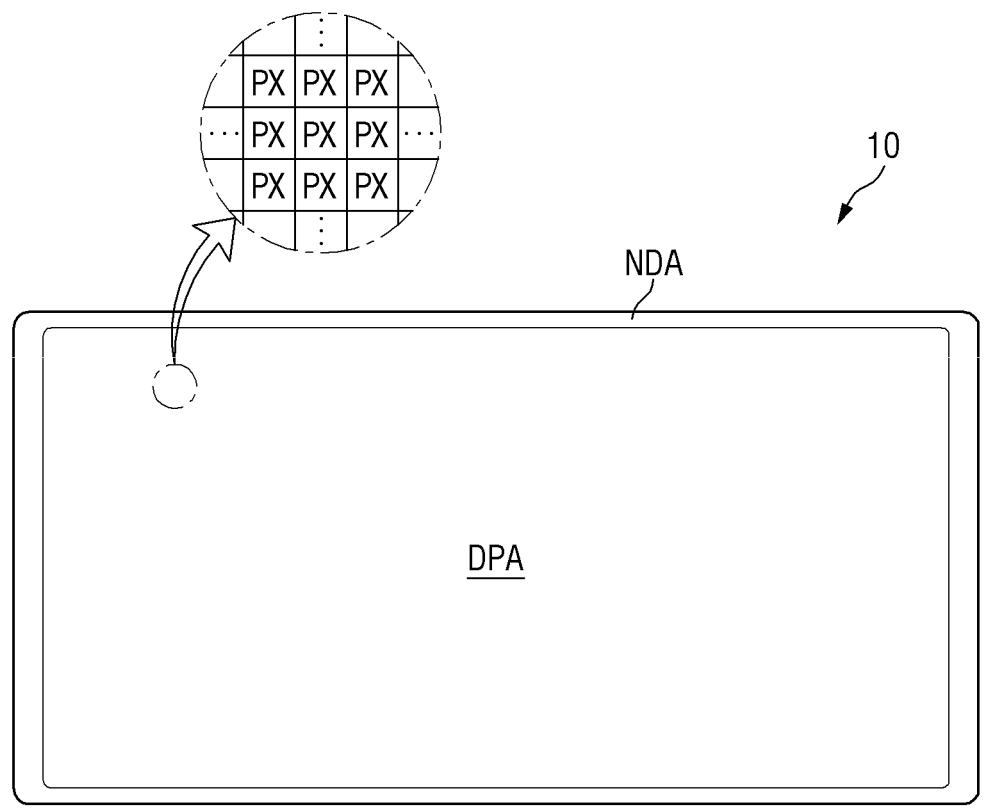
FIG. 1 is a plan view of a display device according to an embodiment.

The present disclosure will now be described more fully hereinafter with reference to the accompanying drawings, in which embodiments are shown. The present disclosure may, however, be embodied in different forms and should not be construed as limited to the embodiments set forth herein. Rather, these embodiments are provided so that this disclosure will be thorough and complete, and will filly convey the scope of the present disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present disclosure and is not intended to be limiting of the described example embodiments of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Hereinafter, embodiments of the present disclosure will be described with reference to the drawings.

FIG. 1 is a plan view of a display device according to an embodiment.

Referring to FIG. 1, a display device 10 displays (e.g., is configured to display) a moving image and/or a still image. The display device 10 may refer to all electronic devices that include a display screen, for example, televisions, laptop computers, monitors, billboards, the Internet of Things (IoT) devices, mobile phones, smartphones, tablet personal computers (PCs), electronic watches, smartwatches, watch phones, head mounted displays, mobile communication terminals, electronic organizers, electronic books, portable multimedia players (PMPs), navigation devices, game machines, digital cameras, camcorders, and the like.

The display device 10 includes a display panel having a display screen. Examples of the display panel include an inorganic light emitting diode display panel, an organic light emitting diode display panel, a quantum dot light emitting display panel, a plasma display panel, a field emission display panel, and the like. Hereinafter, an embodiment in which an inorganic light emitting diode display panel is applied as an example of the display panel will be described by way of example, but the present disclosure is not limited thereto, and the same technical idea may be applied to other display panels if applicable.

Hereinafter, a first direction DR1, a second direction DR2, and a third direction DR3 are defined in the drawings for describing the display device 10. The first direction DR1 and the second direction DR2 may be perpendicular to each other in one plane. The third direction DR3 may be perpendicular to the plane in which the first direction DR1 and the second direction DR2 are positioned. The third direction DR3 is perpendicular to each of the first direction DR1 and the second direction DR2. The third direction DR3 may refer to a thickness direction of the display device 10.

The display device 10 may have a rectangular shape, in a plan view, which includes long sides and short sides with the first direction DR1 being longer than the second direction DR2. A corner portion at where the long side and the short side of the display device 10 meet, in a plan view, may be right-angled, but it is not limited thereto and may have a rounded curved shape. The shape of the display device 10 in a plan view is not limited to that described above, and the display device 10 may have other shapes, such as a square shape, a quadrangular shape with rounded corners (e.g., vertices), a polygonal shape, and a circular shape.

A display surface of the display device 10 may be disposed on one side in the third direction DR3, which is the thickness direction. Unless otherwise stated, "upper portion" refers to one side in the third direction DR3 and refers to a display direction, and "upper surface" refers to a surface facing one side in the third direction DR3. In addition, "lower portion" refers to the other (e.g., the opposite) side in the third direction DR3 and refers to a direction opposite to the display direction, and "lower surface" refers to a surface facing the other side in the third direction DR3. In addition, "left", "right", "upper", and "lower" refer to directions when the display panel 10 is viewed in a plan view. For example, "right side" refers to one side in the first direction DR1, "left side" refers to the other side in the first direction DR1, "upper side" refers to one side in the second direction DR2, and "lower side" refers to the other side in the second direction DR2.

The display device 10 may have a display area DPA and a non-display area NDA. The display area DPA is an area in which a screen is provided (e.g., where an image is displayed), and the non-display area NDA is an area in which a screen is not provided (e.g., where an image is not displayed).

A shape of the display area DPA may follow the shape of the display device 10. For example, the display area DPA may have a rectangular shape in a plan view, similar to the overall shape of the display device 10. The display area DPA may occupy substantially the center of the display device 10.

The display area DPA may include a plurality of pixels PX. The pixel PX may refer to a minimum unit repeated for display. The plurality of pixels PX may be arranged in a matrix pattern.

The non-display area NDA may be disposed around (e.g., may extend around a periphery of) the display area DPA. The non-display area NDA may entirely or partially surround (or extend around the periphery of) the display area DPA. In an embodiment, the display area DPA may have a rectangular shape, and the non-display area NDA may be disposed adjacent to four sides of the display area DPA. The non-display area NDA may form a bezel of the display device 10. Wirings, circuit drivers, or a pad part on which an external device is mounted, which are included in the display device 10, may be disposed in the non-display area NDA.

Figure 2:
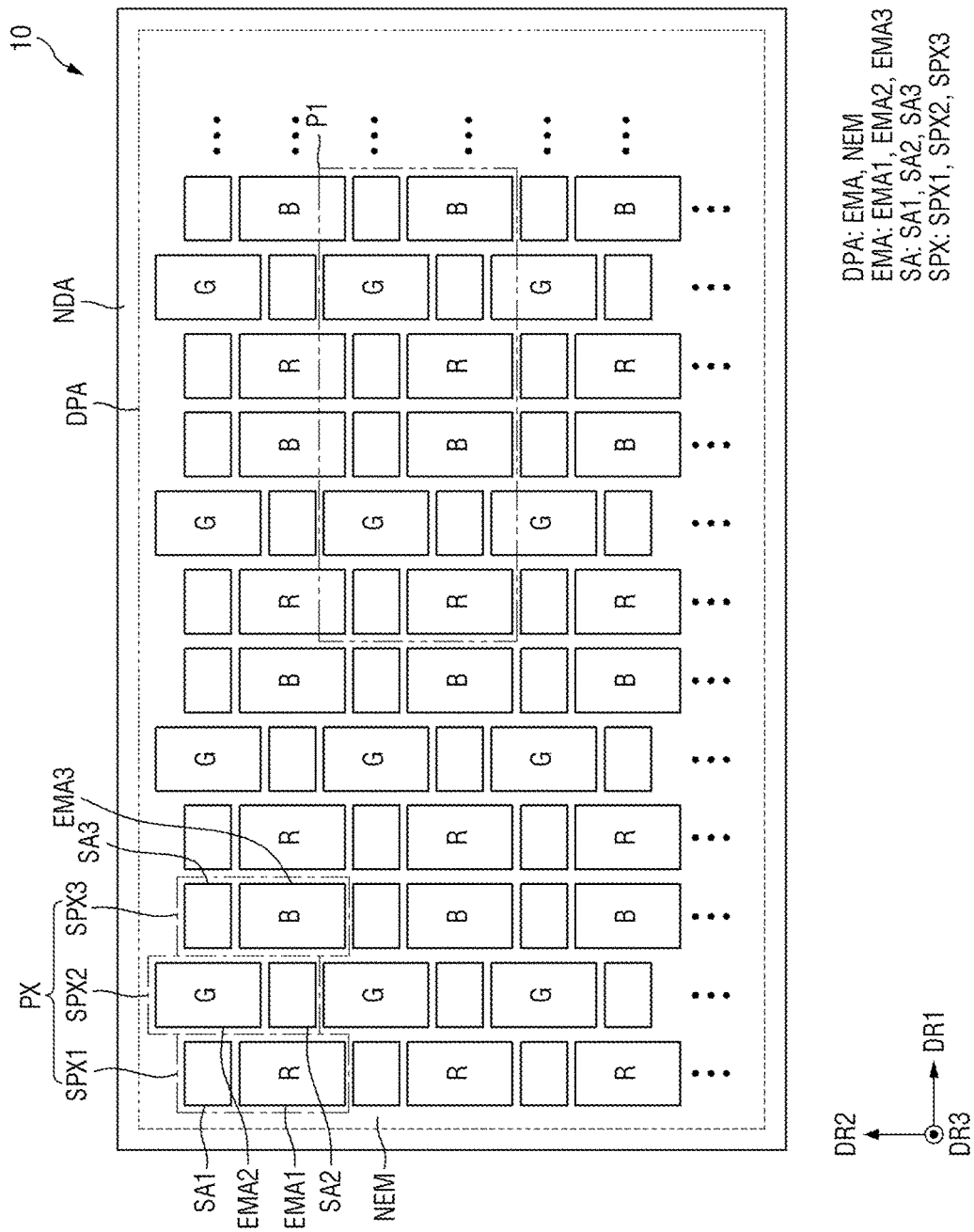
FIG. 2 is a schematic layout view illustrating a layout of emission areas and sub-areas of a display device according to an embodiment.

FIG. 2 is a schematic layout view illustrating a layout (or arrangement) of emission areas and sub-areas of the display device 10 shown in FIG. 1 according to an embodiment.

Referring to FIG. 2, each pixel PX may include a plurality of sub-pixels SPX emitting light of different colors to display full color (e.g., to display full color images). Each pixel PX may include a first sub-pixel SPX1 configured to emit light of a first color, a second sub-pixel SPX2 configured to emit light of a second color, and a third sub-pixel SPX3 configured to emit light of a third color. For example, the first color may be red, the second color may be green, and the third color may be blue. Although it is illustrated in FIG. 2 that one pixel PX includes three sub-pixels SPX, the present disclosure is not limited thereto. For example, one pixel PX may also include a greater number of sub-pixels SPX.

As described above, the respective pixels PX including the plurality of sub-pixels SPX may be alternately arranged in the matrix pattern (or the matrix direction). In an embodiment, shapes, in a plan view, and arrangements of the sub-pixels SPX in each pixel PX may be the same as each other. For example, each of the first sub-pixel SPX1, the second sub-pixel SPX2, and the third sub-pixel SPX3 may have a rectangular shape, in a plan view, including short sides in the first direction DR1 and long sides in the second direction DR2, and the first sub-pixel SPX1, the second sub-pixel SPX2, and the third sub-pixel SPX3 of each pixel PX may be arranged along the second direction DR2. Accordingly, a plurality of first sub-pixels SPX1 may be arranged side-by-side (e.g., arranged adjacent to each other) along the second direction DR2, a plurality of second sub-pixels SPX2 may be arranged side-by-side along the second direction DR2, and a plurality of third sub-pixels SPX3 may be arranged side-by-side along the second direction DR2. For example, the same sub-pixels SPX may be arranged side-by-side along the second direction DR2, and the first to third sub-pixels SPX1, SPX2, and SPX3 may be alternately and repeatedly disposed along the first direction DR1.

Each pixel PX may have an emission area EMA and a non-emission area NEM. The emission area EMA may be an area in which a light emitting element ED, to be described later (see, e.g., FIG. 4), is disposed and light emitted from the light emitting element ED is emitted, and the non-emission area NEM may be an area in which the light emitting element ED is not disposed and light emitted from the light emitting element ED is not emitted.

The emission area EMA may have a first emission area EMA1, a second emission area EMA2, and a third emission area EMA3. The first emission area EMA1 may be an emission area EMA of the first sub-pixel SPX1, the second emission area EMA2 may be an emission area EMA of the second sub-pixel SPX2, and the third emission area EMA3 may be an emission area EMA of the third sub-pixel SPX3.

In an embodiment, the light emitting elements ED disposed in each of the first to third emission areas EMA1, EMA2, and EMA3 may emit light in the same wavelength band (e.g., may emit the same color light). For example, light emitted by the light emitting elements ED each disposed in the first to third emission areas EMA1, EMA2, and EMA3 may be light of a third color, that is, blue light. However, the present disclosure is not limited thereto, and the light emitting elements ED disposed in the first to third emission areas EMA1, EMA2, and EMA3 may emit light of different colors.

A shape, in a plan view, of the emission area EMA included in each sub-pixel SPX may be similar to a shape of the corresponding sub-pixel SPX in a plan view. For example, the emission area EMA included in each sub-pixel SPX may have a rectangular shape, in a plan view, in which the second direction DR2 is longer than the first direction DR1.

The non-emission area NEM may be disposed to surround (e.g., to extend around a periphery of) the emission area NEM. For example, the non-emission area NEM may be disposed to surround the first emission area EMA1, the second emission area EMA2, and the third emission area EMA3.

Each pixel PX may have a sub-area SA positioned in the non-emission area NEM and spaced apart from the emission area EMA. The sub-area SA may be disposed on the upper side (or on one side) in the second direction DR2 or the lower side (or on the other side) in the second direction DR2 of the emission area EMA. The sub-area SA may be an area in which electrode layers 200 (see, e.g., FIG. 4) of the respective sub-pixels SPX neighboring (e.g., adjacent each other) in the second direction DR2 are separated.

The sub-area SA may have a first sub-area SA1, a second sub-area SA2, and a third sub-area SA3. The first sub-area SA1 may be a sub-area SA of the first sub-pixel SPX1, the second sub-area SA2 may be a sub-area SA of the second sub-pixel SPX2, and the third sub-area SA3 may be a sub-area SA of the third sub-pixel SPX3.

In an embodiment, a direction in which the sub-area SA is disposed with respect to the emission area EMA in each pixel PX may be different for each of the sub-pixels SPX adjacent to each other in the first direction DR1. For example, a direction in which the first sub-area SA1 is disposed with respect to the first emission area EMA1 and a direction in which the second sub-area SA2 is disposed with respect to the second emission area EMA2 may be opposite to each other. Similarly, the direction in which the second sub-area SA2 is disposed with respect to the second emission area EMA2 and a direction in which the third sub-area SA3 is disposed with respect to the third emission area EMA3 may be opposite to each other. For example, the first sub-area SA1 may be disposed on the upper side (in FIG. 2) of the first emission area EMA1, the second sub-area SA2 may be disposed on the lower side (in FIG. 2) of the second emission area EMA2, and the third sub-area SA3 may be disposed on the upper side (in FIG. 2) of the third emission area EMA3. Accordingly, the first sub-areas SA1 and the first emission areas EMA1 may be alternately and repeatedly disposed along an opposite direction to the second direction DR2, the second sub-areas SA2 and the second emission areas EMA2 may be alternately and repeatedly disposed along the second direction DR2, and the third sub-area SA3 and the third emission area EMA3 may be alternately and repeatedly disposed along the opposite direction to the second direction DR2.

The first sub-area SA1 of the first sub-pixel SPX1, the second emission area EMA2 of the second sub-pixel SPX2, and the third sub-area SA3 of the third sub-pixel SPX3 may be arranged side-by-side in the first direction DR1 in the same row. For example, the first sub-area SA1, the second emission area EMA2, and the third sub-area SA3 may be alternately and repeatedly disposed along the first direction DR1 in odd-numbered rows. A reference line crossing a central portion of the first sub-area SA1 in the first direction DR1, a reference line crossing a central portion of the second emission area EMA2 in the first direction DR1, and a reference line crossing a central portion of the third sub-area SA3 in the first direction DR1 may be positioned on the same straight line.

Similarly, the first emission area EMA1 of the first sub-pixel SPX1, the second sub-area SA2 of the second sub-pixel SPX2, and the third emission area EMA3 of the third sub-pixel SPX3 may be arranged side-by-side in the first direction DR1 in the same row. For example, the first emission area EMA1, the second sub-area SA2, and the third emission area EMA3 may be alternately and repeatedly disposed along the first direction DR1 in even-numbered rows. A reference line crossing a central portion of the first emission area EMA1 in the first direction DR1, a reference line crossing a central portion of the second sub-area SA2 in the first direction DR1, and a reference line crossing a central portion of the third emission area EMA3 in the first direction DR1 may be positioned on the same straight line.

Figure 3:
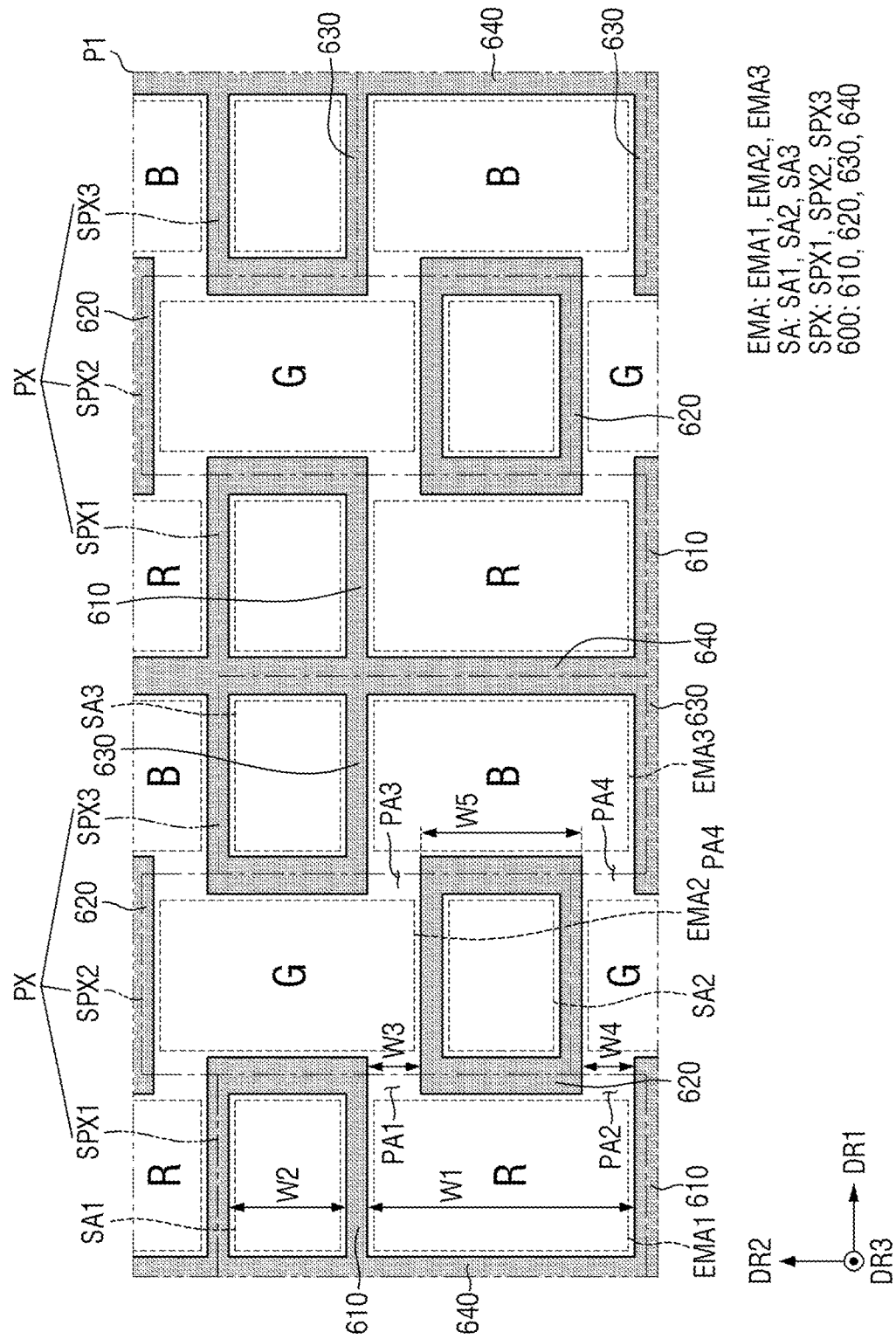
FIG. 3 is an enlarged view illustrating an example of a relative layout, in a plan view, of an emission area, a sub-area, and a first bank disposed in the area P1 of FIG. 2.

FIG. 3 is an enlarged view illustrating an example of a relative layout, in a plan view, of an emission area, a sub-area, and a first bank disposed in the area P1 of FIG. 2.

Referring to FIGS. 2 and 3, the display device 10 may include a first bank 600. Hereinafter, a relative layout and shape between the emission area EMA and the sub-area SA of the display device 10 and the first bank 600 in a plan view will be described.

The first bank 600 may be disposed in the non-emission area NEM and may not be disposed in the emission area EMA. The first bank 600 may be disposed to surround (e.g., extend around) a portion of the emission area EMA and the sub-area SA. The first bank 600 may be disposed to surround the sub-area SA of each sub-pixel SPX to define the sub-area SA.

The first bank 600 may act as a wall disposed to surround portions of the emission areas EMA and the sub-areas SA and may guide ink in which light emitting elements ED (see, e.g., FIG. 4) are dispersed so that the ink is not deposited (e.g., jetted) to the sub-area SA and is stably deposited into the emission area EMA during an inkjet process for aligning the light emitting elements ED from among processes of manufacturing the display device 10. In addition, the first bank 600 may surround a portion of the emission area EMA of each sub-pixel SPX, may not be disposed on at least a portion of the upper side or the lower side (in FIG. 3) of the emission area EMA, and may act to adjust a shape of the ink so that a surface shape of the ink deposited into the emission area EMA is substantially flat.

The first bank 600 may include a first wall 610, a second wall 620, and a third wall 630. The first bank 600 may further include a fourth wall 640.

The first wall 610 may be disposed to surround the first sub-area SA1 of the first sub-pixel SPX1. The first wall 610 may include an opening overlapping the first sub-area SA1 in the third direction DR3 to define the first sub-area SA1 (e.g., the first wall 610 may extend around the first sub-area SA1 to define the first sub-area SA1).

As described above, the first sub-areas SA1 and the first emission areas EMA1 of the first sub-pixel SPX1 are alternately and repeatedly disposed in the second direction DR2, and thus, the first wall 610 surrounding the first sub-area SA1 may be disposed between the first emission areas EMA1 disposed adjacent to each other in the second direction DR2. For example, the first walls 610 may be disposed on the upper side and the lower side (in FIG. 3) of the first emission area EMA1, respectively.

In addition, as described above, the first sub-area SA1 may be arranged side by side with the second emission area EMA2 and the third sub-area SA3 in the first direction DR1. Accordingly, the first wall 610 surrounding the first sub-area SA1 of one pixel PX may be disposed between the second emission area EMA2 of the one pixel PX and a third sub-area SA3 of another pixel PX disposed adjacent to the one pixel PX on the left side of the one pixel PX.

The first wall 610 disposed in one pixel PX may be disposed between the first emission areas EMA1 arranged side-by-side in the second direction DR2 in an area between the third sub-area SA3 of another pixel PX disposed on the left side in a plan view and the second emission area EMA2 of the one pixel PX. The first wall 610 may be disposed on the upper side of the first emission area EMA1 and, at the same time, may be disposed on the left side of the second emission area EMA2, in one pixel PX.

The second wall 620 may be disposed to be spaced apart from the first wall 610. The second wall 620 may be disposed adjacent to the first wall 610 in a diagonal direction and may be spaced apart from the first wall 610 in the second direction DR2. For example, the second wall 620 disposed in one pixel PX may be disposed adjacent to the first wall 610 on the lower right side of the first wall 610 disposed in the same pixel PX but may be spaced apart from the first wall 610 in the second direction DR2.

The second wall 620 may be disposed to surround the second sub-area SA2 of the second sub-pixel SPX2. The second wall 620 may include an opening overlapping the second sub-area SA2 in the third direction DR3 to define the second sub-area SA2.

As described above, the second sub-areas SA2 and the second emission areas EMA2 of the second sub-pixel SPX2 are alternately and repeatedly disposed in the second direction DR2, and thus, the second wall 620 surrounding the second sub-area SA2 may be disposed between the second emission areas EMA2 disposed adjacent to each other in the second direction DR2. For example, the second walls 620 may be disposed on the upper side and the lower side (in FIG. 3) of the second emission area EMA2, respectively.

In addition, as described above, the second sub-area SA2 may be arranged side-by-side with the first emission area EMA1 and the third emission area EMA3 in the first direction DR1. Accordingly, the second wall 620 surrounding the second sub-area SA2 of one pixel PX may be disposed between the first emission area EMA1 and the third emission area EMA3 of the same pixel PX.

For example, the second wall 620 disposed in one pixel PX may be disposed between the second emission areas EMA2 arranged side-by-side in the second direction DR2 in an area between the first emission area EMA1 and the third emission area EMA3 of the one pixel PX in a plan view. The second wall 620 may be disposed on the lower side of the second emission area EMA2 and, at the same time, may be disposed on the right side of the first emission area EMA1 and the left side of the third emission area EMA3, in one pixel PX.

The third wall 630 may be disposed to be spaced apart from the second wall 620. The third wall 630 may be disposed adjacent to the second wall 620 in a diagonal direction but may be spaced apart from the second wall 620 in the second direction DR2. For example, the third wall 630 disposed in one pixel PX may be disposed adjacent to the second wall 620 on the upper right side of the second wall 620 disposed in the same pixel PX and may be spaced apart from the second wall 620 in the second direction DR2. In addition, the third wall 630 may be disposed to spaced apart from the first wall 610 disposed in the same pixel PX in the first direction DR1. The third wall 630 may be spaced apart from the first wall 610 disposed in the same one pixel PX in the first direction DR1, but may be integrated with a first wall 610 of a pixel PX disposed adjacent to the one pixel PX in the first direction DR1 to form one pattern.

The third wall 630 may be disposed to surround the third sub-area SA3 of the third sub-pixel SPX3. The third wall 630 may include an opening overlapping the third sub-area SA3 in the third direction DR3 to define the third sub-area SA3.

As described above, the third sub-areas SA3 and the third emission areas EMA3 of the third sub-pixel SPX3 are alternately and repeatedly disposed in the second direction DR2, and thus, the third wall 630 surrounding the third sub-area SA3 may be disposed between the third emission areas EMA3 disposed adjacent to each other in the second direction DR2. For example, the third walls 630 may be disposed on the upper side and the lower side of the third emission area EMA3, respectively.

In addition, as described above, the third sub-area SA3 may be arranged side-by-side with the second emission area EMA2 and the first sub-area SA1 in the first direction DR1. Accordingly, the third wall 630 surrounding the third sub-area SA3 of one pixel PX may be disposed between the second emission area EMA2 of the one pixel PX and a first sub-area SA1 of another pixel PX adjacent to the one pixel PX on the right side of the one pixel PX.

The third wall 630 disposed in one pixel PX may be disposed between the third emission areas EMA3 arranged side by side in the second direction DR2 in an area between the first sub-area SA1 of another pixel PX disposed on the right side in a plan view and the second emission area EMA2 of the one pixel PX. The third wall 630 may be disposed on the upper side of the first emission area EMA3 and at the same time, be disposed on the right side of the second emission area EMA2, in one pixel PX.

The fourth wall 640 may be disposed at a boundary between the respective pixels PX adjacent to each other in the first direction DR1. The fourth wall 640 may be disposed at the boundary between the respective pixels PX adjacent to each other in the first direction DR1 and may not be disposed at a boundary between the respective pixels PX adjacent to each other in the second direction DR2. The fourth wall 640 may have a shape extending in the second direction DR2 in a plan view. The fourth wall 640 may be formed to have a shape extending in the second direction DR2 in a plan view at the boundary between the respective pixels PX and may act to divide the pixels PX adjacent to each other in the first direction DR1.

The first wall 610 may include portions extending in the first direction DR1 and the second direction DR2 in a plan view. Hereinafter, unless otherwise stated in embodiments describing shapes of the first to third walls 610, 620, and 630 of the first bank 600 in a plan view, portions of the first to third walls 610, 620, and 630 extending in the first direction DR1 may be referred to as transverse portions of the first to third walls 610, 620, and 630 and portions of the first to third walls 610, 620, and 630 extending in the second direction DR2 may be referred to as longitudinal portions of the first to third walls 610, 620, and 630.

The transverse portions of the first wall 610 may be disposed at boundaries between the first emission areas EMA1 and the first sub-area SA1. For example, the transverse portions of the first wall 610 may be disposed at the boundaries between the first emission areas EMA1 disposed adjacent to the first sub-area SA1 in the second direction DR2 and the first sub-area SA1. The transverse portions of the first wall 610 may be disposed at the boundaries between the first emission areas EMA1 disposed on the upper side and the lower side of the first sub-area SA1 and the first sub-area SA1. Accordingly, the first emission area EMA1 and the first sub-area SA1 may be divided by the transverse portion of the first wall 610.

The longitudinal portions of the first wall 610 may be disposed at a boundary between the first sub-pixel SPX1 and the second sub-pixel SPX2 disposed on the right side of the first sub-pixel SPX1 and a boundary between the first sub-pixel SPX1 and the third sub-pixel SPX3 disposed on the left side of the first sub-pixel SPX1. For example, the longitudinal portions of the first wall 610 may be disposed at a boundary between the second emission area EMA2 disposed on the right side of the first sub-area SA1 and the first sub-area SA1 and may be disposed at a boundary between a third sub-area SA3 of another pixel PX disposed on the left side of the first sub-area SA1 and the first sub-area SA1. The longitudinal portion of the first wall 610 is disposed at least at the boundary between the first sub-area SA1 and the second emission area EMA2 such that the first sub-area SA1 and the second emission area EMA2 may be divided by the longitudinal portion of the first wall 610.

The second wall 620 may include portions extending in the first direction DR1 and the second direction DR2 in a plan view.

The transverse portions of the second wall 620 may be disposed at boundaries between the second emission areas EMA2 and the second sub-area SA2. For example, the transverse portions of the second wall 620 may be disposed at the boundaries between the second emission areas EMA2 disposed adjacent to the second sub-area SA2 in the second direction DR2 and the second sub-area SA2. The transverse portions of the second wall 620 may be disposed at the boundaries between the second emission areas EMA2 disposed on the upper side and the lower side of the second sub-area SA2 and the second sub-area SA2. Accordingly, the second emission area EMA2 and the second sub-area SA2 may be divided by the transverse portion of the second wall 620.

The longitudinal portions of the second wall 620 may be disposed at a boundary between the second sub-pixel SPX2 and the first sub-pixel SPX1 and a boundary between the second sub-pixel SPX2 and the third sub-pixel SPX3 disposed on the right side of the second sub-pixel SPX2. For example, the longitudinal portions of the second wall 620 may be disposed at a boundary between the first emission area EMA1 disposed on the left side of the second sub-area SA2 and the second sub-area SA2 and may be disposed at a boundary between the third emission area EMA3 disposed on the right side of the second sub-area SA2 and the second sub-area SA2.

The longitudinal portions of the second wall 620 are disposed at the boundaries between the first and third emission areas EMA1 and EMA3 and the second sub-area SA2 in one pixel PX such that the first and third emission areas EMA1 and EMA3 and the second sub-area SA2 may be divided by the second wall 620.

The third wall 630 may include portions extending in the first direction DR1 and the second direction DR2 in a plan view.

The transverse portions of the third wall 630 may be disposed at boundaries between the third emission areas EMA3 and the third sub-area SA3. For example, the transverse portions of the third wall 630 may be disposed at the boundaries between the third emission areas EMA3 disposed adjacent to the third sub-area SA3 in the second direction DR2 and the third sub-area SA3. The transverse portions of the third wall 630 may be disposed at the boundaries between the third emission areas EMA3 disposed on the upper side and the lower side of the third sub-area SA3 and the third sub-area SA3. Accordingly, the third emission area EMA3 and the third sub-area SA3 may be divided by the transverse portion of the third wall 630.

The longitudinal portions of the third wall 630 may be disposed at a boundary between the third sub-pixel SPX3 and the first sub-pixel SPX1 disposed on the right side of the third sub-pixel SPX3 and a boundary between the third sub-pixel SPX3 and the second sub-pixel SPX2 disposed on the left side of the third sub-pixel SPX3. For example, the longitudinal portions of the third wall 630 may be disposed at a boundary between the second emission area EMA2 disposed on the left side of the third sub-area SA3 and the third sub-area SA3 and may be disposed at a boundary between a first sub-area SA1 of another pixel PX disposed on the right side of the third sub-area SA3 and the third sub-area SA3. The longitudinal portion of the third wall 630 is disposed at least at the boundary between the third sub-area SA3 and the second emission area EMA2 such that the third sub-area SA3 and the second emission area EMA2 may be divided by the longitudinal portion of the third wall 630.

The third wall 630 disposed in one pixel PX and the first wall 610 disposed in another pixel PX disposed on the right side of the one pixel PX may be integrated with each other to form one pattern. Accordingly, the longitudinal portion of the third wall 630 and the longitudinal portion of the first wall 610 may be disposed between the third sub-area SA3 of one pixel PX and the first sub-area SA1 of another pixel PX disposed on the right side of the one pixel PX, and the longitudinal portion of the third wall 630 and the longitudinal portion of the first wall 610 disposed between the third sub-area SA3 and the first sub-area SA1 may contact each other such that they may not be physically apparent (e.g., may be integrally formed).

The fourth wall 640 may be disposed at a boundary between the third emission area EMA3 of one pixel PX and the first emission area EMA1 of another pixel PX disposed on the right side of the one pixel PX. The fourth wall 640 may be disposed at the boundary between the third emission area EMA3 and the first emission area EMA1 to divide the third emission area EMA3 and the first emission area EMA1.

In an embodiment, the fourth wall 640 may extend in the second direction DR2 and may be integrated with the first wall 610 and the third wall 630 disposed on the upper side and the lower side thereof to form one pattern. The fourth wall 640 is formed to divide the pixels PX disposed adjacent to each other in the first direction DR1 such that the fourth wall 640 may prevent or substantially prevent ink in which the plurality of light emitting elements ED are dispersed from overflowing into the pixels PX disposed adjacent to each other in the first direction DR1 during the inkjet process for aligning the light emitting elements ED among the processes of manufacturing the display device 10.

In an embodiment, widths W1, in the second direction DR2, of the emission areas EMA of each sub-pixel SPX may be the same as each other. For example, a width W1 of the first emission area EMA1 in the second direction DR2, a width W1 of the second emission area EMA2 in the second direction DR2, and a width W1 of the third emission area EMA3 in the second direction DR2 may be equal to each other. However, the present disclosure is not limited thereto, and the widths of the first emission area EMA1 and the third emission area EMA3 disposed in the same row may be the same as each other while the width of the second emission area EMA2 disposed in a different row may be different from the width of the first emission area EMA1 or the third emission area EMA3 in the second direction DR2.

The width W1 of the emission area EMA in the second direction DR2 may be measured as an interval between the walls disposed on the upper side and the lower side of each emission area EMA. For example, the width W1 of the first emission area EMA1 in the second direction DR2 may be measured as an interval W1 between the first walls 610 each disposed on the upper side and the lower side of the first emission area EMA1, the width W1 of the second emission area EMA2 in the second direction DR2 may be measured as an interval W1 between the second walls 620 each disposed on the upper side and the lower side of the second emission area EMA2, and the width W1 of the third emission area EMA3 in the second direction DR2 may be measured as an interval W1 between the third walls 630 each disposed on the upper side and the lower side of the third emission area EMA3.

Widths W2, in the second direction DR2, of the sub-areas SA of each sub-pixel SPX may be the same as each other. For example, a width W2 of the first sub-area SA1 in the second direction DR2, a width W2 of the second sub-area SA2 in the second direction DR2, and a width W2 of the third sub-area SA3 in the second direction DR2 may be equal to each other. However, the present disclosure is not limited thereto, and the widths of the first sub-area SA1 and the third sub-area SA3 disposed in the same row may be the same as each other while the width of the second sub-area SA2 disposed in a different row may be different from the width of the first sub-area SA1 or the third sub-area SA3 in the second direction DR2.

The width W2 of the sub-area SA in the second direction DR2 may be measured as an interval W2 between the transverse portions of the wall surrounding each sub-area SA. For example, the width W2 of the first sub-area SA1 in the second direction DR2 may be measured as an interval W2 between the transversal portions of the first wall 610 surrounding the first sub-area SA1, the width W2 of the second sub-area SA2 in the second direction DR2 may be measured as an interval W2 between the transversal portions of the second wall 620 surrounding the second sub-area SA2, and the width W2 of the third sub-area SA3 in the second direction DR2 may be measured as an interval W2 between the transversal portions of the third wall 630 surrounding the third sub-area SA3.

The width W1 of the emission area EMA in the second direction DR2 and the width W2 of the sub-area SA in the second direction DR2 may be different from each other. In an embodiment, the width W1 of the emission area EMA in the second direction DR2 may be greater than the width W2 of the sub-area SA in the second direction DR2.

A length W5 of each of the first to third walls 610, 620, and 630 in the second direction DR2 may be smaller than the width W1 of the emission area EMA in the second direction DR2. The length W5 of each of the first to third walls 610, 620, and 630 in the second direction DR2 is smaller than the width W1 of the emission area EMA in the second direction DR2, such that the second wall 620 may be disposed to be spaced apart from the first wall 610 or the third wall 630.

Specifically, the length W5, in the second direction DR2, of the second wall 620 disposed adjacent to the first emission area EMA1 on the right side of the first emission area EMA1 may be smaller than the width W1 of the first emission area EMA1 in the second direction DR2. For example, the length W5, in the second direction DR2, of the second wall 620 disposed adjacent to the first emission area EMA1 on the right side of the first emission area EMA1 may be smaller than the interval W1 between the first walls 610 each disposed adjacent to the first emission area EMA1 on the upper side and the lower side of the first emission area EMA1. The length W5 of the second wall 620 in the second direction DR2 is smaller than the width W1 of the first emission area EMA1 in the second direction DR2 such that the first walls 610 each disposed on the upper side and the lower side of the first emission area EMA1 may be spaced apart from the second wall 620 in the second direction DR2.

The second wall 620 may also be disposed adjacent to the third emission area EMA3 on the left side of the third emission area EMA3. The length W5, in the second direction DR2, of the second wall 620 disposed adjacent to the third emission area EMA3 on the left side of the third emission area EMA3 may be smaller than the width W1 of the third emission area EMA3 in the second direction DR2, similar to the first emission area EMA1. For example, the length W5, in the second direction DR2, of the second wall 620 disposed adjacent to the third emission area EMA3 on the left side of the third emission area EMA3 may be smaller than the interval W1 between the third walls 630 each disposed adjacent to the third emission area EMA3 on the upper side and the lower side of the third emission area EMA3. The length W5 of the second wall 620 in the second direction DR2 is smaller than the width W1 of the third emission area EMA3 in the second direction DR2 such that the third walls 630 each disposed on the upper side and the lower side of the third emission area EMA3 may be spaced apart from the second wall 620 in the second direction DR2.

The second wall 620 is disposed to surround the second sub-area SA2 between the first emission area EMA1 and the third emission area EMA3, and the length W5 of the second wall 620 in the second direction DR2 is smaller than the width W1 of the first and third emission areas EMA1 and EMA3 in the second direction DR2 such that the first bank 600 may not be disposed on the upper side or the lower side of each emission area EMA in a boundary area of each sub-pixel SPX. Accordingly, passages PA1 and PA2 defined as areas between the first and second walls 610 and 620 may be formed between the first and second emission areas EMA1 and EMA2, and passages PA3 and PA4 defined as areas between the second and third walls 620 and 630 may be formed between the second and third emission areas EMA2 and EMA3. The passages PA1 and PA2 defined as the areas between the first and second walls 610 and 620 between the first and second emission areas EMA1 and EMA2 may include a first passage PA1 defined as an area between the first and second walls 610 and 620 included in the same pixel PX and a second passage PA2 defined as an area between a first wall 610 included in another pixel PX adjacent in the second direction DR2 and the second wall 620. Similarly, the passages PA3 and PA4 defined as the areas between the second and third walls 620 and 630 between the second and third emission areas EMA2 and EMA3 may include a third passage PA3 defined as an area between the third and second walls 630 and 620 included in the same pixel PX and a fourth passage PA4 defined as an area between a third wall 630 included in another pixel PX adjacent in the second direction DR2 and the second wall 620.

The first to fourth passages PA1, PA2, PA3, and PA4 may be flow passages through which ink jetted into the emission area EMA may flow (e.g., move) from upper and lower sides of the emission area EMA to the other emission areas EMA during the inkjet process for aligning the light emitting elements ED from among the processes of manufacturing the display device 10. Accordingly, the ink jetted into the emission area EMA of the one sub-pixel SPX may flow to the emission area EMA of another sub-pixel SPX disposed in at least the same pixel PX through the first to fourth passages PA1, PA2, PA3, and PA4. The ink jetted into each emission area EMA is induced to flow from one emission area EMA to the other emission areas EMA through the first to fourth passages PA1, PA2, PA3, and PA4 such that a surface shape of the ink jetted into the emission area EMA may be flat at an upper side and a lower side of each emission area EMA. Accordingly, a flow of the ink that may be generated by the surface shape of the ink may be prevented or substantially prevented to prevent or substantially prevent the light emitting elements aligned during the process for aligning the light emitting elements from being collected upward and downward in the emission areas EMA due to the shape of the ink. A detailed description thereof will be provided later.

In an embodiment, an interval W3 between the first wall 610 disposed on the upper side of the first emission area EMA1 and the second wall 620 disposed on the right side of the first emission area EMA1 may be the same as an interval W4 between the first wall 610 disposed on the lower side of the first emission area EMA1 and the second wall 620 disposed on the right side of the first emission area EMA1. However, the present disclosure is not limited thereto, and the interval W3 between the first wall 610 and the second wall 620 disposed on the right side of the first emission area EMA1 and the interval W4 between the first wall 610 disposed on the lower side of the first emission area EMA1 and the second wall 620 disposed on the right side of the first emission area EMA1 may also be different from each other.

The interval W3 between the first wall 610 disposed on the upper side of the first emission area EMA1 and the second wall 620 disposed on the right side of the first emission area EMA1 may be smaller than the length W5 of the second wall 620 in the second direction DR2. In addition, the interval W4 between the first wall 610 disposed on the lower side of the first emission area EMA1 and the second wall 620 disposed on the right side of the first emission area EMA1 may be smaller than the length W5 of the second wall 620 in the second direction DR2. Because the interval W3 between the first wall 610 disposed on the upper side of the first emission area EMA1 and the second wall 620 disposed on the right side of the first emission area EMA1 and the interval W4 between the first wall 610 disposed on the lower side of the first emission area EMA1 and the second wall 620 disposed on the right side of the first emission area EMA1 are smaller than the length W5 of the second wall 620 in the second direction DR2, the light emitting element ED may not move to the other emission areas EMA through the passages PA1, PA2, PA3, and PA4 when the ink flows through the passages PA1, PA2, PA3, and PA4.

The second wall 620 is disposed to be spaced apart from not only the first wall 610 and the third wall 630 disposed in the same pixel PX but also from the first wall 610 and the third wall 630 disposed in another pixel PX disposed adjacent to the same pixel on the lower side of the same pixel such that the ink jetted into the emission area EMA may also flow to the emission area EMA of the sub-pixel SPX included in another pixel PX.

Figure 4:
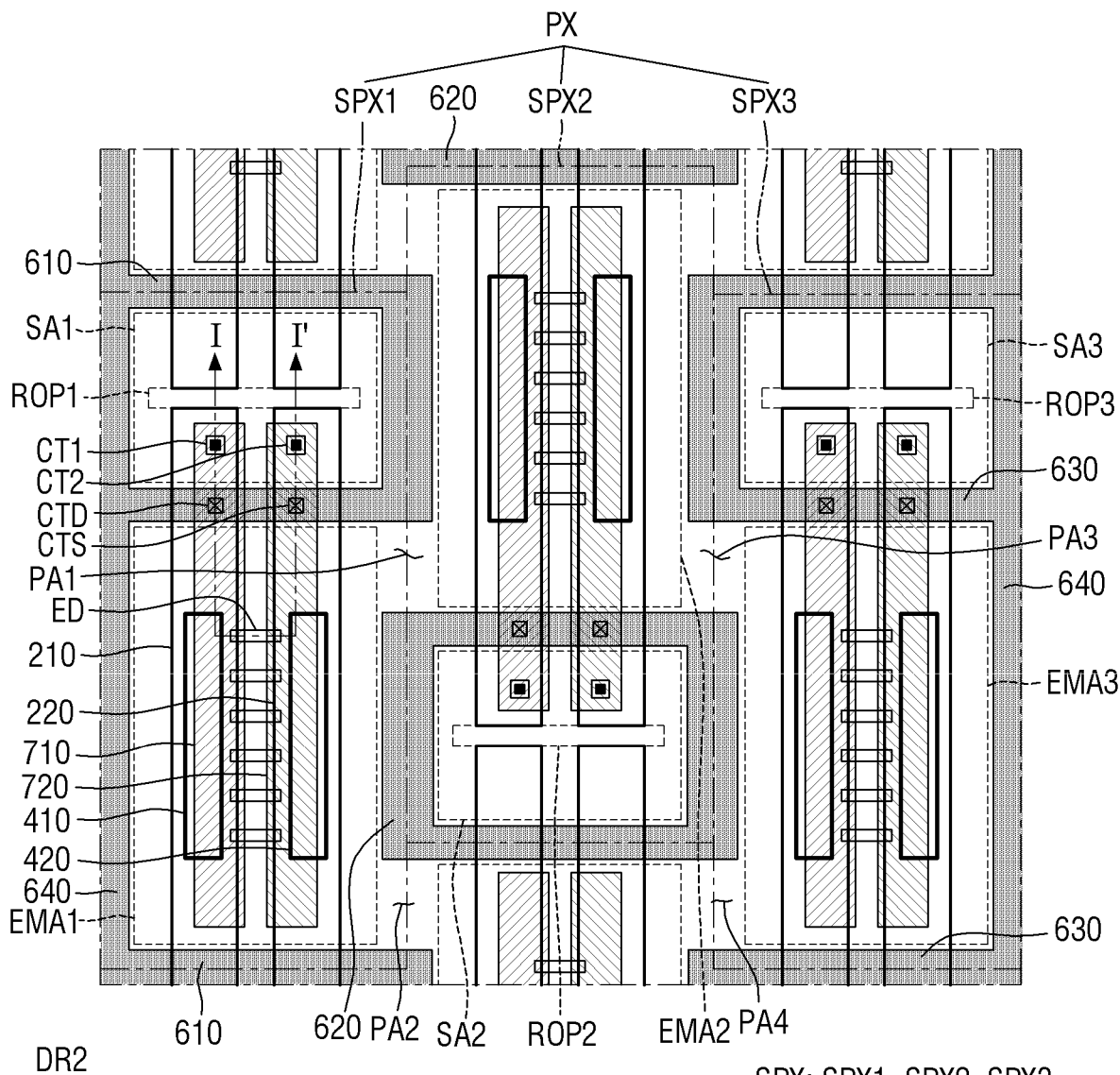
FIG. 4 is a schematic plan layout view of one pixel according to the embodiment shown in FIG. 3.

FIG. 4 is a schematic plan layout view of one pixel according to the embodiment shown in FIG. 3.

Referring to FIG. 4, the display device 10 may include a second bank 400, the electrode layer 200, a contact electrode 700, a plurality of light emitting elements ED, and the first bank 600. The second bank 400, the electrode layer 200, the contact electrode 700, and the plurality of light emitting elements ED may be disposed for each sub-pixel SPX.

The electrode layer 200 may be disposed over the emission area EMA and the sub-area SA. For example, the electrode layer 200 may be disposed over the first emission area EMA1 and the first sub-area SA1 of the first sub-pixel SPX1, over the second emission area EMA2 and the second sub-area SA2 of the second sub-pixel SPX2, and over the third emission area EMA3 and the third sub-area SA3 of the third sub-pixel SPX3.

The electrode layer 200 may include a plurality of electrodes extending in the second direction DR2 and spaced apart from each other in the first direction DR1. For example, the electrode layer 200 may include a first electrode 210 and a second electrode 220.

The first electrode 210 and the second electrode 220 may be disposed over the emission area EMA and the sub-area SA of each sub-pixel SPX but may be spaced apart from a first electrode 210 and a second electrode 220 included in a sub-pixel SPX neighboring in the second direction DR2, respectively, at a separation part ROP positioned in the sub-area SA. For example, the first electrode 210 and the second electrode 220 included in the first sub-pixel SPX1 may extend in the second direction DR2 in a plan view but may be spaced apart from a first electrode 210 and a second electrode 220 included in a first sub-pixel SPX1 neighboring in the second direction DR2, respectively, at the first separation part ROP1 positioned in the first sub-area SA1. Similarly, the first electrode 210 and the second electrode 220 included in the second sub-pixel SPX2 may extend in the second direction DR2 in a plan view but may be spaced apart from a first electrode 210 and a second electrode 220 included in a second sub-pixel SPX2 neighboring in the second direction DR2, respectively, at a second separation part ROP2 positioned in the second sub-area SA1. The first electrode 210 and the second electrode 220 included in the third sub-pixel SPX3 may extend in the second direction DR2 in a plan view but may be spaced apart from a first electrode 210 and a second electrode 220 included in a third sub-pixel SPX3 neighboring in the second direction DR2, respectively, at a third separation part ROP3 positioned in the third sub-area SA3.

The first electrode 210 and the second electrode 220 separated at the separation part ROP of each sub-pixel SPX may be formed after the process for aligning a plurality of light emitting elements ED from among the processes of manufacturing the display device 10. For example, during the process for aligning a plurality of light emitting elements ED from among the processes of manufacturing the display device 10, an electric field may be generated using alignment lines extending in the second direction DR2, and the plurality of light emitting elements ED may be aligned by a dielectrophoretic force caused by the electric field generated on (or between) the alignment lines. After the process for aligning the light emitting elements ED is performed, a plurality of alignment lines are separated at the separation part ROP positioned in the sub-area SA of each sub-pixel SPX such that the first electrode 210 and the second electrode 220 separated at the separation part ROP of each sub-pixel SPX may be formed, as illustrated in FIG. 4.

The first electrode 210 may be electrically connected to a circuit element layer CCL, to be described later (see, e.g., FIG. 5), through a first electrode contact opening (e.g., a first electrode contact hole) CTD. The second electrode 220 may be electrically connected to a circuit element layer CCL, to be described later, through a second electrode contact opening (e.g., a second electrode contact hole) CTS. The first electrode 210 is electrically connected to the circuit element layer CCL through the first electrode contact hole CTD and the second electrode 220 is electrically connected to the circuit element layer CCL through the second electrode contact hole CTS such that an electrical signal applied to the circuit element layer CCL may be transferred to both ends of the light emitting element ED through the first electrode 210 and the second electrode 220. While it is illustrated in FIG. 4 that the first and second electrode contact holes CTD and CTS are disposed to overlap the first bank 600 in the third direction DR3, positions of the first and second electrode contact holes CTD and CTS are not limited thereto.

The second bank 400 may be disposed in the emission area EMA. For example, the second bank 400 may be disposed in each of the first to third emission areas EMA1, EMA2, and EMA3, which are the respective emission areas EMA of the first to third sub-pixels SPX1, SPX2, and SPX3.

The second bank 400 may include a plurality of sub-banks extending in the second direction DR2 and that are spaced apart from each other in the first direction DR1. For example, the second bank 400 may include a first sub-bank 410 and a second sub-bank 420.

The first sub-bank 410 may be disposed to overlap the first electrode 210 in the third direction DR3 in the emission area EMA of each sub-pixel SPX. The second sub-bank 420 may be disposed to overlap the second electrode 220 in the third direction DR3 in the emission area EMA of each sub-pixel SPX.

The plurality of light emitting elements ED may be disposed in the emission area EMA. For example, the plurality of light emitting elements ED may be disposed in each of the first to third emission areas EMA1, EMA2, and EMA3, which are the respective emission areas EMA of the first to third sub-pixels SPX1, SPX2, and SPX3. The plurality of light emitting elements ED may not be disposed in the sub-area SA. As described above, the first bank 600 is disposed around the sub-area SA of each sub-pixel SPX such that the ink in which the plurality of light-emitting elements ED are dispersed is jetted only into the emission area EMA. Thus, the plurality of light emitting elements ED may be disposed in the emission area EMA and may not be disposed in the sub-area SA.

The plurality of light emitting elements ED may be disposed between the first sub-bank 410 and the second sub-bank 420 in the emission area EMA. The light emitting element ED may have a shape extending in one direction, and an extension direction of the light emitting element ED may be substantially perpendicular to an extension direction of the first electrode 210 and the second electrode 220. However, the present disclosure is not limited thereto, and the extension direction of the light emitting element ED may be oblique to the extension direction of the first electrode 210 and the second electrode 220. The light emitting element ED may be disposed so that at least one of both ends (e.g., opposite ends) thereof is on the first electrode 210 or the second electrode 220 in an area in which the first sub-bank 410 and the second sub-bank 420 are spaced apart from and face each other.

The plurality of light emitting elements ED may be disposed to be spaced apart from each other. The plurality of light emitting elements ED may be disposed to be spaced apart from each other along the second direction DR2 between the first sub-bank 410 and the second sub-bank 420. The plurality of light emitting elements ED may be aligned in one column between the first sub-bank 410 and the second sub-bank 420, and distances between the light emitting elements ED disposed adjacent to each other in the second direction DR2 may vary (e.g., may be random).

The contact electrode 700 may be disposed over the emission area EMA and the sub-area SA. For example, the contact electrode 700 may be disposed over the first emission area EMA1 and the first sub-area SA1 of the first sub-pixel SPX1, over the second emission area EMA2 and the second sub-area SA2 of the second sub-pixel SPX2, and over the third emission area EMA3 and the third sub-area SA3 of the third sub-pixel SPX3.

The contact electrode 700 may include a plurality of contact electrodes extending in the second direction DR2 and spaced apart from each other in the first direction DR1. For example, the contact electrode 700 may include a first contact electrode 710 and a second contact electrode 720.

The first contact electrode 710 may be disposed to overlap the first electrode 210 in the third direction DR3 in the emission area EMA and the sub-area SA of each sub-pixel SPX. The first contact electrode 710 may be disposed to overlap one end of the plurality of light emitting elements ED in the emission area EMA of each sub-pixel SPX.

The first contact electrode 710 may contact the first electrode 210 through a first contact part CT1 in the sub-area SA of each sub-pixel SPX and may contact one end of the plurality of light emitting elements ED in the emission area EMA of each sub-pixel SPX. The first contact electrode 710 contacts each of one end of the light emitting element ED and the first electrode 210 such that the first contact electrode 710 may electrically connect one end of the light emitting element ED and the first electrode 210 to each other. While it has been illustrated in FIG. 4 that the first contact electrode 710 contacts the first electrode 210 in the sub-area SA of each sub-pixel SPX, the present disclosure is not limited thereto. For example, the first contact electrode 710 may contact the first electrode 210 in the emission area EMA of each sub-pixel SPX.

The second contact electrode 720 may be disposed to overlap the second electrode 220 in the third direction DR3 in the emission area EMA and the sub-area SA of each sub-pixel SPX. The second contact electrode 720 may be disposed to overlap the other ends of the plurality of light emitting elements ED in the emission area EMA of each sub-pixel SPX.

The second contact electrode 720 may contact the second electrode 220 through a second contact part CT2 in the sub-area SA of each sub-pixel SPX and may contact the other end of the plurality of light emitting elements ED in the emission area EMA of each sub-pixel SPX. The second contact electrode 720 contacts each of the other end of the light emitting element ED and the second electrode 220 such that the second contact electrode 720 may electrically connect the other end of the light emitting element ED and the second electrode 220 to each other. While it has been illustrated in FIG. 4 that the second contact electrode 720 contacts the second electrode 220 in the sub-area SA of each sub-pixel SPX, the present disclosure is not limited thereto. For example, the second contact electrode 720 may contact the second electrode 220 in the emission area EMA of each sub-pixel SPX.

The first contact electrode 710 and the second contact electrode 720 disposed in the first sub-pixel SPX1 may contact the first electrode 210 and the second electrode 220, respectively, in the first sub-area SA1 disposed on the upper side of the first emission area EMA1. The first contact electrode 710 and the second contact electrode 720 disposed in the second sub-pixel SPX2 may contact the first electrode 210 and the second electrode 220, respectively, in the second sub-area SA2 disposed on the lower side of the second emission area EMA2. The first contact electrode 710 and the second contact electrode 720 disposed in the third sub-pixel SPX3 may contact the first electrode 210 and the second electrode 220, respectively, in the third sub-area SA3 disposed on the upper side of the third emission area EMA3.

The first sub-area SA1 of the first sub-pixel SPX1 is disposed on the upper side of the first emission area EMA1, the second sub-area SA2 of the second sub-pixel SPX2 is disposed on the lower side of the second emission area EMA2, and the third sub-area SA3 of the third sub-pixel SPX3 is disposed on the upper side of the third emission area EMA3 such that the second emission area EMA2 may overlap upper and lower areas of the first emission area EMA1 and the third emission area EMA3 in the first direction DR1.

As described above, the first contact electrode 710 and the second contact electrode 720 may be spaced apart from each other in the first direction DR1. An interval between the first contact electrode 710 and the second contact electrode 720 may be smaller than a length of the light emitting element ED in the extension direction of the light emitting element ED. Accordingly, the first contact electrode 710 and the second contact electrode 720 may be spaced apart from each other in the first direction DR1 but may contact both ends (e.g., may respectively contact opposite ends) of the light emitting element ED, respectively.

The first bank 600 may be disposed to surround the sub-area SA so as to divide the sub-area SA and the emission area EMA and to guide the ink in which the plurality of light emitting elements ED are dispersed so that the ink is not jetted to the sub-area SA and is stably jetted to the emission area EMA during the inkjet process for aligning the plurality of light emitting elements ED.

The first bank 600 may include a hydrophobic material. Because the first bank 600 includes a hydrophobic material, even though the ink in which the plurality of light emitting elements ED are dispersed is jetted onto the first bank 600 positioned at a boundary between the sub-area SA and the emission area EMA, the ink may be induced to be positioned in the emission area EMA.

The first bank 600 may also adjust a cross-sectional shape of the ink so that a shape of the ink jetted onto the emission area EMA and applied into the emission area EMA is flat at an upper side or a lower side of the emission area EMA in a plan view. For example, the first bank 600 includes the hydrophobic material such that a surface contact angle may be formed at an edge of the ink applied into the emission area EMA. As described above, the first to third walls 610, 620, and 630 included in one pixel PX are disposed to be spaced apart from each other in the second direction DR2 such that the passages PA1, PA2, PA3, and PA4 may be formed between the first to third emission areas EMA1, EMA2, and EMA3. Accordingly, the ink applied into the first to third emission areas EMA1, EMA2, and EMA3 may flow to the other emission areas EMA1, EMA2, and EMA3 through the passages PA1, PA2, PA3, and PA4. Accordingly, the inks jetted into the first to third emission areas EMA1, EMA2, and EMA3 and applied into each emission area EMA may be connected to each other through the passages PA1, PA2, PA3, and PA4 and may have a flat cross-sectional shape even at the upper side or the lower side of each emission area EMA.

The plurality of light emitting elements ED dispersed in the ink applied into the emission area EMA may move according to the flow of the ink as well as due to a dielectrophoretic force generated by an electric field generated on the electrode layer 200, and the light emitting elements ED may be aligned at specific positions in the emission area EMA. For example, during the process for aligning the plurality of light emitting elements ED, the ink may be jetted into the first to third emission areas EMA1, EMA2, and EMA3 and an alignment signal may be applied to the alignment lines using the alignment lines corresponding to the electrode layer 200. An electric field may be generated on the alignment lines by the alignment signal, and the plurality of light emitting elements ED dispersed in the ink applied into the emission area EMA may be seated on the alignment lines while changing their orientations direction and/or positions according to the electric field. The electric field may cause the ink in which the plurality of light emitting elements ED are dispersed to flow in a specific direction. Accordingly, the positions of the plurality of light emitting elements ED may be affected by a flow direction and a flow velocity of the ink as well as a direction of the electric field and an electric field strength. The flow direction and flow velocity of the ink may be adjusted according to the cross-sectional shape of the applied ink. For example, when the surface contact angle of the ink at the edge of the ink is relatively large, the flow direction of the ink may be a direction from an inner portion of the ink toward the edge of the ink due to a difference in a flow velocity in the ink. On the other hand, when the surface of the ink is flat, a difference in flow velocity in the ink is small, such that the flow of the ink may be relatively small.

Accordingly, in the display device 10 according to the present disclosure, an alignment degree of the light emitting elements ED may be improved by adjusting the surface shape of the ink jetted into the emission area EMA by using the shape of the first bank 600, which acts as the wall in the inkjet process for aligning the light emitting elements ED. For example, the display device 10 may have the emission area EMA and the sub-area SA adjacent to each other in the second direction DR2 and may include the plurality of electrodes 210 and 220 extending in the second direction DR2 and crossing the emission area EMA and the sub-area SA and the first bank 600. The first bank 600 may surround the sub-area SA and the emission area EMA, but the passages PA1, PA2, PA3, and PA4 may be formed to expose an upper area and a lower area of the emission area EMA. Accordingly, during the inkjet process for aligning the light emitting elements ED, the ink jetted into the emission area EMA is induced to flow from one emission area EMA to the other emission areas EMA through the passages, such that the surface shape of the ink seated in the emission area EMA may be flat even at an upper side and a lower side of the emission area EMA. Accordingly, the flow of the ink that may be generated by the surface shape of the ink may be prevented or substantially prevented to prevent or substantially prevent the light emitting elements ED aligned in the process for aligning the light emitting elements ED from being collected upward and downward in the emission areas EMA due to the shape of the ink. Therefore, the alignment degree of the light emitting elements ED aligned between the plurality of electrodes 210 and 220 in the emission area EMA may be improved to improve a display quality of the display device.

Figure 5:
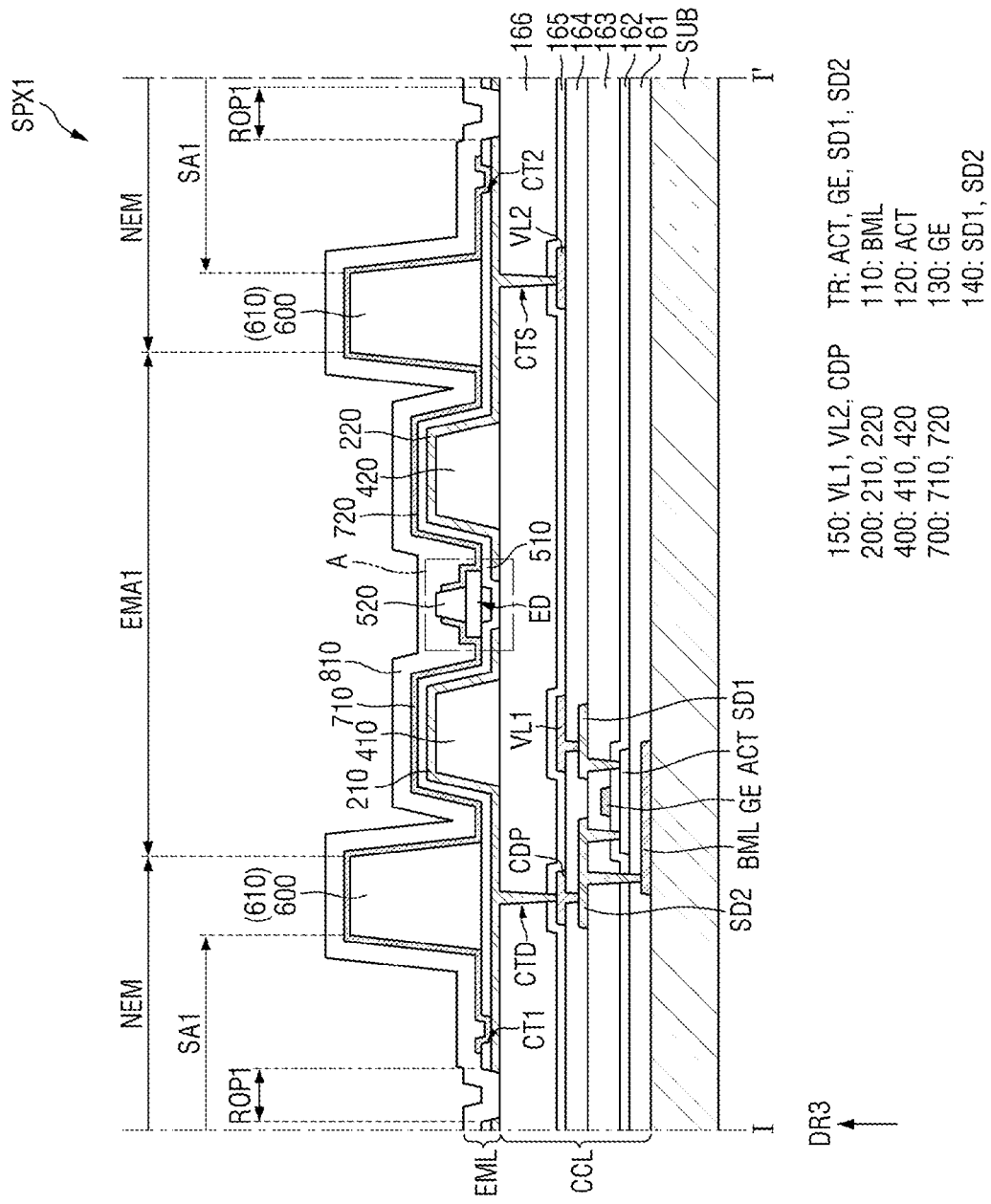
FIG. 5 is a cross-sectional view illustrating an example taken along the line I-I' of FIG. 4.

FIG. 5 is a cross-sectional view illustrating an example taken along the line I-I' of FIG. 4.

Hereinafter, a schematic cross-sectional structure of the first sub-pixel SPX1 of the display device 10 will be described with reference to FIG. 5. The schematic cross-sectional structure of the first sub-pixel SPX1 may be similarly applied to the second sub-pixel SPX2 and the third sub-pixel SPX3. Accordingly, a description for cross-sectional structures of the second sub-pixel SPX2 and the third sub-pixel SPX3 will be replaced with a description of the cross-sectional structures of the first sub-pixel SPX1.

The display device 10 may include a substrate SUB, a circuit element layer CCL, and a light emitting element layer EML.

The substrate SUB may be a base substrate or a base member. The substrate SUB may include (or may be made of) an insulating material, such as glass, quartz, or a polymer resin. The substrate SUB may be a rigid substrate or may be a flexible substrate capable of being bent, folded, or rolled.

The circuit element layer CCL may be disposed on the substrate SUB. The circuit element layer CCL may include at least one transistor and the like to drive the light emitting element layer EML of each sub-pixel SPX.

The circuit element layer CCL may include a lower metal layer 110, a semiconductor layer 120, a first conductive layer 130, a second conductive layer 140, a third conductive layer 150, and a plurality of insulating films.

The lower metal layer 110 is disposed on the substrate SUB. The lower metal layer 110 may include a light blocking pattern BML. The light blocking pattern BML may be disposed below a transistor TR so as to cover at least a channel region of an active layer ACT of the transistor TR. However, the present disclosure is not limited thereto, and the light blocking pattern BML may be omitted. The lower metal layer 110 may include a light blocking material. For example, the lower metal layer 110 may be formed of an opaque metal material that blocks or substantially blocks transmission of light therethrough.

A buffer layer 161 may be disposed on the lower metal layer 110. The buffer layer 161 may be disposed to cover the entire surface of the substrate SUB on which the lower metal layer 110 is disposed. The buffer layer 161 may protect a plurality of transistors from moisture permeating through the substrate SUB, which may be vulnerable to moisture permeation.

The semiconductor layer 120 is disposed on the buffer layer 161. The semiconductor layer 120 may include the active layer ACT of the transistor TR. The active layer ACT of the transistor TR may be disposed to overlap the light blocking pattern BML of the lower metal layer 110, as described above.

The semiconductor layer 120 may include polycrystalline silicon, single crystal silicon, an oxide semiconductor, or the like. In an embodiment, when the semiconductor layer 120 includes the polycrystalline silicon, the polycrystalline silicon may be formed by crystallizing amorphous silicon. When the semiconductor layer 120 includes the polycrystalline silicon, the active layer ACT of the transistor TR may include a plurality of doped regions doped with impurities and a channel region between the plurality of doped regions. In another embodiment, the semiconductor layer 120 may include an oxide semiconductor. The oxide semiconductor may be, for example, indium tin oxide (ITO), indium zinc oxide (IZO), indium gallium oxide (IGO), indium zinc tin Oxide (IZTO), indium gallium zinc oxide (IGZO), indium gallium tin oxide (IGTO), indium gallium zinc tin oxide (IGZTO), or the like.

A gate insulating film 162 may be disposed on the semiconductor layer 120. The gate insulating film 162 may be formed as multiple layers in which inorganic layers, including at least one of silicon oxide (SiOx), silicon nitride (SiNx), and silicon oxynitride (SiOxNy), are alternately stacked.

The first conductive layer 130 may be disposed on the gate insulating film 162. The first conductive layer 130 may include a gate electrode GE of the transistor TR. The gate electrode GE may be disposed to overlap the channel region of the active layer ACT in the third direction DR3, which is the thickness direction of the substrate SUB.

A first interlayer insulating film 163 may be disposed on the first conductive layer 130. The first interlayer insulating film 163 may be disposed to cover the gate electrode GE. The first interlayer insulating film 163 may be an insulating film between the first conductive layer 130 and other layers disposed on the first conductive layer 130 and may protect the first conductive layer 130.

The second conductive layer 140 may be disposed on the first interlayer insulating film 163. The second conductive layer 140 may include a drain electrode SD1 of the transistor TR and a source electrode SD2 of the transistor TR.

The drain electrode SD1 and the source electrode SD2 of the transistor TR may be electrically connected to both end regions of the active layer ACT of the transistor TR through contact openings (e.g., contact holes) penetrating through the first interlayer insulating film 163 and the gate insulating film 162, respectively. In addition, the source electrode SD2 of the transistor TR may be electrically connected to the light blocking pattern BML of the lower metal layer 110 through another contact opening (e.g., another contact hole) penetrating through the first interlayer insulating film 163, the gate insulating film 162, and the buffer layer 161.

A second interlayer insulating film 164 may be disposed on the second conductive layer 140. The second interlayer insulating film 164 may be disposed to cover the drain electrode SD1 of the transistor TR and the source electrode SD2 of the transistor TR. The second interlayer insulating film 164 may be an insulating film between the second conductive layer 140 and other layers disposed on the second conductive layer 140 and may protect the second conductive layer 140.

The third conductive layer 150 may be disposed on the second interlayer insulating film 164. The third conductive layer 150 may include a first voltage line VL1, a second voltage line VL2, and a conductive pattern CDP.

The first voltage line VL1 may overlap at least a portion of the drain electrode SD1 of the transistor TR in the thickness direction of the substrate SUB. A high potential voltage (e.g., a first source voltage) supplied to the transistor TR may be applied to the first voltage line VL1.

The second voltage line VL2 may be electrically connected to the second electrode 220 through the second electrode contact hole CTS penetrating through a via layer 166 and a passivation layer 165, to be described later. A low potential voltage (e.g., a second source voltage) lower than the high potential voltage supplied to the first voltage line VL1 may be applied to the second voltage line VL2. For example, the high potential voltage (e.g., the first source voltage) supplied to the transistor TR may be applied to the first voltage line VL1, and the low potential voltage (e.g., the second source voltage) lower than the high potential voltage supplied to the first voltage line VL1 may be applied to the second voltage line VL2.

The conductive pattern CDP may be electrically connected to the source electrode SD2 of the transistor TR. The conductive pattern CDP may be electrically connected to the source electrode SD2 of the transistor TR through a contact opening (e.g., a contact hole) penetrating through the second interlayer insulating film 164. In addition, the conductive pattern CDP may be electrically connected to the first electrode 210 through the first electrode contact hole CTD penetrating through a via layer 166 and the passivation layer 165, to be described later.

The passivation layer 165 may be disposed on the third conductive layer 150. The passivation layer 165 may be disposed to cover the third conductive layer 150. The passivation layer 165 may protect the third conductive layer 150.

Each of the buffer layer 161, the gate insulating film 162, the first interlayer insulating film 163, the second interlayer insulating film 164, and the passivation layer 165 described above may be formed as a plurality of inorganic layers that are alternately stacked. For example, each of the buffer layer 161, the gate insulating film 162, the first interlayer insulating film 163, the second interlayer insulating film 164, and the passivation layer 165 described above may be formed as a double layer in which inorganic layers, including at least one of silicon oxide (SiOx), silicon nitride (SiNx), and silicon oxynitride (SiOxNy), are stacked on each other or multiple layers in which these layers are alternately stacked on each other. However, the present disclosure is not limited thereto, and each of the buffer layer 161, the gate insulating film 162, the first interlayer insulating film 163, the second interlayer insulating film 164, and the passivation layer 165 may also be formed as one inorganic layer including the insulating material described above.

The via layer 166 may be disposed on the passivation layer 165. The via layer 166 may have a substantially flat surface regardless of a shape or presence or absence of a pattern disposed therebelow. For example, the via layer 166 may planarize an upper portion of the passivation layer 165.

The via layer 166 may include an organic insulating material, for example, an organic material, such as polyimide (PI).

Referring to FIGS. 4 and 5, the light emitting element layer EML may be disposed on the circuit element layer CCL. The light emitting element layer EML may include the second bank 400, the electrode layer 200, a first insulating layer 510, the first bank 600, the light emitting elements ED, a second insulating layer 520, and the contact electrode 700. The light emitting element layer EML may further include a protective layer 810.

The second bank 400 may be disposed on the via layer 166. The second bank 400 may be directly disposed on an upper surface of the via layer 166. Each of the first sub-bank 410 and the second sub-bank 420 included in the second bank 400 may have a structure in which at least a portion thereof protrudes from the upper surface of the via layer 166 in a cross-sectional view.

The first sub-bank 410 and the second sub-bank 420 may induce the plurality of light emitting elements ED to be disposed between the first electrode 210 and the second electrode 220 during the process for aligning the plurality of light emitting elements ED from among the processes of manufacturing the display device 10. A spaced space between the first sub-bank 410 and the second sub-bank 420 may provide an area in which the plurality of light emitting elements ED are disposed.

In addition, the first sub-bank 410 and the second sub-bank 420 may have inclined side surfaces to change a traveling direction of light emitted from the light emitting element ED that travels toward the side surfaces of the first sub-bank 410 and the second sub-bank 420 into an upward direction. For example, the second bank 400 may provide a space in which the light emitting element ED is disposed and also acts as a reflective wall changing the traveling direction of the light emitted from the light emitting element ED into the upward direction.

While it has been illustrated in FIG. 5 that each side surface of the plurality of sub-banks 410 and 420 included in the second bank 400 has a linear inclined shape, the present disclosure is not limited thereto. For example, the side surfaces (or outer surfaces) of the plurality of sub-banks 410 and 420 included in the second bank 400 may also have a curved semicircular or semielliptical shape. In an embodiment, the second bank 400 may include an organic insulating material, such as polyimide (PI), but is not limited thereto.

The electrode layer 200 may be disposed on the second bank 400 and the via layer 166 exposed by the second bank 400. The electrode layer 200 may be disposed over the first emission area EMA1 and the first sub-area SA1.

Each of the first electrode 210 and the second electrode 220 may be disposed on the via layer 166 exposed by the second bank 400 in the first emission area EMA1 and may be disposed on the via layer 166 in the non-emission area NEM.

In the first emission area EMA1, the first electrode 210 may be disposed on the first sub-bank 410, and the second electrode 220 may be disposed on the second sub-bank 420. In the first emission area EMA1, the first electrode 210 and the second electrode 220 may be disposed on at least the inclined side surfaces of the first sub-bank 410 and the second sub-bank 420, respectively. The first and second electrodes 210 and 220 may be disposed to cover one side surface of each of the first and second sub-banks 410 and 420 that face each other to reflect the light emitted from the light emitting element ED.

The first electrode 210 may be electrically connected to the circuit element layer CCL through the first electrode contact hole CTD penetrating through the via layer 166 and the passivation layer 165, and the second electrode 220 may be electrically connected to the circuit element layer CCL through the second electrode contact hole CTS penetrating through the via layer 166 and the passivation layer 165. For example, the first electrode 210 may be electrically connected to the conductive pattern CDP through the first electrode contact hole CTD, and the second electrode 220 may be electrically connected to the second voltage line VL2 through the second electrode contact hole CTS. The first electrode 210 may contact an upper surface of the conductive pattern CDP exposed by the first electrode contact hole CTD, and the second electrode 220 may contact an upper surface of the second voltage line VL2 exposed by the second electrode contact hole CTS. The first electrode 210 may be electrically connected to the transistor TR through the conductive pattern CDP. The second source voltage may be applied to the second electrode 220 through the second voltage line VL2. While it has been illustrated in FIG. 5 that the first and second electrode contact holes CTD and CTS are disposed to overlap the first bank 600 (e.g., the first wall 610) in the third direction DR3, positions of the first and second electrode contact holes CTD and CTS are not limited thereto.

As described above, the first electrode 210 and the second electrode 220 may be spaced apart from the first electrode 210 and the second electrode 220 included in the first sub-pixel SPX1 neighboring in the second direction DR2, respectively, at the first separation part ROP1 positioned in the first sub-area SA1. Accordingly, in the first separation part ROP1, the via layer 166 may be exposed by (or through) the first electrode 210 and the second electrode 220.

The first electrode 210 and the second electrode 220 may be electrically connected to the light emitting element ED. The first electrode 210 and the second electrode 220 may be connected to both ends (e.g., opposite ends) of the light emitting element ED through the first contact electrode 710 and the second contact electrode 720, respectively, and may transfer the electrical signal applied from the circuit element layer CCL to the light emitting element ED.

The electrode layer 200 may include a conductive material having high reflectivity. For example, the electrode layer 200 may include a metal, such as silver (Ag), copper (Cu), aluminum (Al), molybdenum (Mo), or titanium (Ti), or may include an alloy including aluminum (Al), nickel (Ni), lanthanum (La), or the like as the material having the high reflectivity. The electrode layer 200 may reflect the light emitted from the light emitting element ED that travels toward the side surfaces of the second bank 400 in an upward direction of the first sub-pixel SPX1. However, the present disclosure is not limited thereto, and the electrode layer 200 may further include a transparent conductive material. For example, the electrode layer 200 may include a material such as ITO, IZO, or ITZO. In some embodiments, the electrode layer 200 may have a structure in which one or more layers including (or made of) the transparent conductive material and one or more layers including (or made of) the metal having the high reflectivity are stacked or may be formed as one layer including the transparent conductive material and the metal having the high reflectivity. For example, the electrode layer 200 may have a stacked structure, such as ITO/Ag/ITO, ITO/Ag/IZO, or ITO/Ag/ITZO/IZO.

The first insulating layer 510 may be disposed on the electrode layer 200. The first insulating layer 510 may be disposed to cover the electrode layer 200 and the via layer 166 exposed by the electrode layer 200. The first insulating layer 510 may protect the electrode layer 200 and may insulate the first electrode 210 and the second electrode 220 from each other.

The first insulating layer 510 may include first and second contact parts CT1 and CT2 exposing at least portions of the first electrode 210 and the second electrode 220. The contact electrode 700 and the electrode layer 200 may be electrically connected to each other through the first and second contact parts CT1 and CT2 penetrating through the first insulating layer 510. While it has been illustrated in FIG. 5 that the first and second contact parts CT1 and CT2, which expose a portion of the electrode layer 200, are positioned in the first sub-area SA1, the present disclosure is not limited thereto. For example, the first and second contact parts CT1 and CT2 exposing portions of the electrode layer 200 may also be positioned in the first emission area EMA1.

The first bank 600 may be disposed on the first insulating layer 510. The first bank 600 may be disposed to surround the sub-area SA to define the sub-area SA. The first bank 600 may be disposed in the non-emission area NEM along a boundary between the sub-area SA and the emission area EMA and may divide the sub-area SA and the emission area EMA. In FIG. 5, which illustrates the cross-sectional structure of the first sub-pixel SPX1, the first bank 600, for example, the first wall 610, may be disposed at the boundary between the first sub-area SA1 and the first emission area EMA1 on the first insulating layer 510 to divide the first emission area EMA1 and the first sub-area SA1.

The first bank 600 may be disposed on the first insulating layer 510 and formed to have a height (e.g., a predetermined height). The height of the first bank 600 may be greater than that of the second bank 400. Because the first bank 600 has the height and is disposed to surround the first sub-area SA1, the ink in which the plurality of light emitting elements ED are dispersed may be jetted into the first emission area EMA1 and may not be jetted into the first sub-area SA1 during the inkjet process for aligning the light emitting elements ED from among the processes of manufacturing the display device 10. In an embodiment, the first bank 600 may include an organic insulating material, such as polyimide (PI), but is not limited thereto.

The light emitting element ED may be disposed on the first insulating layer 510 in the first emission area EMA1. The light emitting element ED may be disposed in the first emission area EMA1 and may not be disposed in the first sub-area SA1. The light emitting element ED may be disposed between the first sub-bank 410 and the second sub-bank 420 in the first emission area EMA1. The light emitting element ED may be disposed so that both ends thereof are on the first electrode 210 and the second electrode 220, respectively.

The light emitting element ED may emit light in a wavelength band. For example, the light emitting element ED may emit light of a third color (e.g., blue light) having a peak wavelength in the range of 480 nm or less or a peak wavelength in the range of 445 nm to 480 nm or less.

The second insulating layer 520 may be disposed on the light emitting element ED. The second insulating layer 520 may be disposed to partially surround an outer surface of the light emitting element ED but may be disposed so as not to cover both ends of the light emitting element ED. Accordingly, a width of the second insulating layer 520 may be smaller than a length of the light emitting element ED. A portion of the second insulating layer 520 disposed on the light emitting element ED may be disposed to extend in the second direction DR2 on the first insulating layer 510 in a plan view to form a linear or island-shaped pattern in the first sub-pixel SPX1. The second insulating layer 520 may protect the light emitting element ED and fix the light emitting element ED during the process of manufacturing the display device 10.

The contact electrode 700 may be disposed on the second insulating layer 520. The first contact electrode 710 and the second contact electrode 720 included in the contact electrode 700 may be spaced apart from each other with the second insulating layer 520 interposed therebetween. The first and second contact electrodes 710 and 720 may electrically connect the first and second electrodes 210 and 220 to the light emitting element ED, respectively.

The first contact electrode 710 may contact each of the first electrode 210 and one end of the light emitting element ED. For example, the first contact electrode 710 may contact one end of the light emitting element ED exposed by the second insulating layer 520 in the first emission area EMA1 and may contact the first electrode 210 exposed by the first contact part CT1 penetrating through the first insulating layer 510 in the first sub-area SA1. The first contact electrode 710 contacts each of one end of the light emitting element ED and the first electrode 210 such that the first contact electrode 710 may electrically connect one end of the light emitting element ED and the first electrode 210 to each other.

The second contact electrode 720 may contact each of the second electrode 220 and the other end of the light emitting element ED. For example, the second contact electrode 720 may contact the other end of the light emitting element ED exposed by the second insulating layer 520 in the first emission area EMA1 and may contact the second electrode 220 exposed by the second contact part CT2 penetrating through the first insulating layer 510 in the first sub-area SA1. The second contact electrode 720 contacts each of the other end of the light emitting element ED and the second electrode 220 such that the second contact electrode 720 may electrically connect the other end of the light emitting element ED and the second electrode 220 to each other.

The contact electrode 700 may include a conductive material. For example, the contact electrode 700 may include ITO, IZO, ITZO, aluminum (Al), or the like. As an example, the contact electrode 700 may include a transparent conductive material, and the light emitted from the light emitting element ED may be transmitted through the contact electrode 700 and then travel toward the first electrode 210 and the second electrode 220 and may be reflected by outer surfaces of the first electrode 210 and the second electrode 220.

The protective layer 810 may be disposed on the contact electrode 700. The protective layer 810 may be disposed to cover the entire surface of the substrate SUB to protect the second bank 400, the electrode layer 200, the plurality of light emitting elements ED, the contact electrode 700, and the first bank 600 disposed below the protective layer 810.

Figure 6:
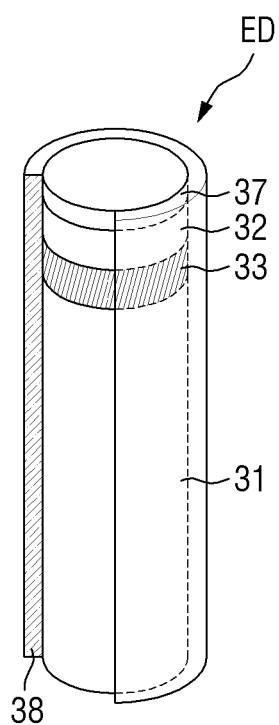
FIG. 6 is a schematic perspective view of a light emitting element according to an embodiment.

FIG. 6 is a schematic perspective view of a light emitting element according to an embodiment.

Referring to FIG. 6, the light emitting element ED is a particle type element and may have a rod or cylindrical shape having an aspect ratio (e.g., a predetermined aspect ratio). A length of the light emitting element ED is greater than a diameter of the light emitting element ED, and the aspect ratio of the light emitting element ED may be 6:5 to 100:1, but the present disclosure is not limited thereto.

The light emitting element ED may have a size of a nanometer scale (1 nm or more but less than 1 μm) to a micrometer scale (1 µm or more but less than 1 mm). In an embodiment, the light emitting element ED may have a size of a nanometer scale or have a size of a micrometer scale in both the length and the diameter. In some embodiments, the diameter of the light emitting element ED may have a size of a nanometer scale, while the length of the light emitting element ED may have a size of a micrometer scale. In some embodiments, some of the light emitting elements ED have sizes of a nanometer scale in diameter and/or length, while the others of the light emitting elements ED may have a size of a micrometer scale in diameter and/or length.

In an embodiment, the light emitting element ED may be an inorganic light emitting diode. The inorganic light emitting diode may include a plurality of semiconductor layers. For example, the inorganic light emitting diode may include a first conductivity-type (e.g., n-type) semiconductor layer, a second conductivity-type (e.g., p-type) semiconductor layer, and an active semiconductor layer interposed between the first conductivity-type semiconductor layer and the second conductivity-type semiconductor layer. The active semiconductor layer may receive holes and electrons from the first conductivity-type semiconductor layer and the second conductivity-type semiconductor layer, respectively, and the holes and the electrons reaching the active semiconductor layer may be combined with each other to emit light.

In an embodiment, the above-described semiconductor layers may be sequentially stacked along one direction, which is a length direction of the light emitting element ED. The light emitting element ED may include a first semiconductor layer 31, an element active layer 33, and a second semiconductor layer 32 that are sequentially stacked in the one direction. The first semiconductor layer 31, the element active layer 33, and the second semiconductor layer 32 may be the above-described first conductivity-type semiconductor layer, active semiconductor layer, and second conductivity-type semiconductor layer, respectively.

The first semiconductor layer 31 may be doped with a first conductivity-type dopant. The first conductivity-type dopant may be Si, Ge, Sn, or the like. In an embodiment, the first semiconductor layer 31 may be made of n-GaN doped with n-type Si.

The second semiconductor layer 32 may be disposed to be spaced apart from the first semiconductor layer 31 with the element active layer 33 interposed therebetween. The second semiconductor layer 32 may be doped with a second conductivity-type dopant, such as Mg, Zn, Ca, Se, or Ba. In an embodiment, the second semiconductor layer 32 may be made of p-GaN doped with p-type Mg.

The element active layer 33 may include a material having a single or multiple quantum well structure. As described above, the element active layer 33 may emit light by a combination of electron-hole pairs according to an electrical signal applied through the first semiconductor layer 31 and the second semiconductor layer 32.

In some embodiments, the element active layer 33 may have a structure in which semiconductor materials having large band gap energy and semiconductor materials having small band gap energy are alternately stacked and may include other Group III to Group V semiconductor materials depending on a wavelength band of emitted light.

The light emitted from the element active layer 33 may be emitted not only to both end surfaces of the light emitting element ED in the length direction but also to an outer circumferential surface (or an outer surface or a side surface) of the light emitting element. For example, an emission direction of the light from the element active layer 33 is not limited to one direction.

The light emitting element ED may further include an element electrode layer 37 disposed on the second semiconductor layer 32. The element electrode layer 37 may contact the second semiconductor layer 32. The element electrode layer 37 may be an ohmic contact electrode, but is not limited thereto. In some embodiments, the element electrode layer 37 may be a Schottky contact electrode.

The element electrode layer 37 may be disposed between the second semiconductor layer 32 and the contact electrode 700 to reduce resistance therebetween when both ends of the light emitting element ED and the contact electrode 700 are electrically connected to each other to apply an electrical signal to the first semiconductor layer 31 and the second semiconductor layer 32. The element electrode layer 37 may include at least one of aluminum (Al), titanium (Ti), indium (In), gold (Au), silver (Ag), indium tin oxide (ITO), indium zinc oxide (IZO), and indium tin zinc oxide (ITZO). The element electrode layer 37 may include an n-type or p-type doped semiconductor material.

The light emitting element ED may further include an element insulating film 38 surrounding (e.g., extending around) outer peripheral surfaces of the first semiconductor layer 31, the second semiconductor layer 32, the element active layer 33, and/or the element electrode layer 37. The element insulating film 38 may be disposed to surround at least an outer surface of the element active layer 33 and may extend in one direction in which the light emitting element ED extends. The element insulating film 38 may protect the first semiconductor layer 31, the second semiconductor layer 32, the element active layer 33, and the element electrode layer 37. The element insulating film 38 may include (or may be made of) materials having insulating properties to prevent an electrical short-circuit that may otherwise occur i the element active layer 33 directly contacted an electrode through which an electrical signal is transferred to the light emitting element ED. In addition, the element insulating film 38 protects the outer peripheral surfaces of the first and second semiconductor layers 31 and 32 as well as the element active layer 33 and, thus, may prevent a decrease in luminous efficiency.

Figure 7:
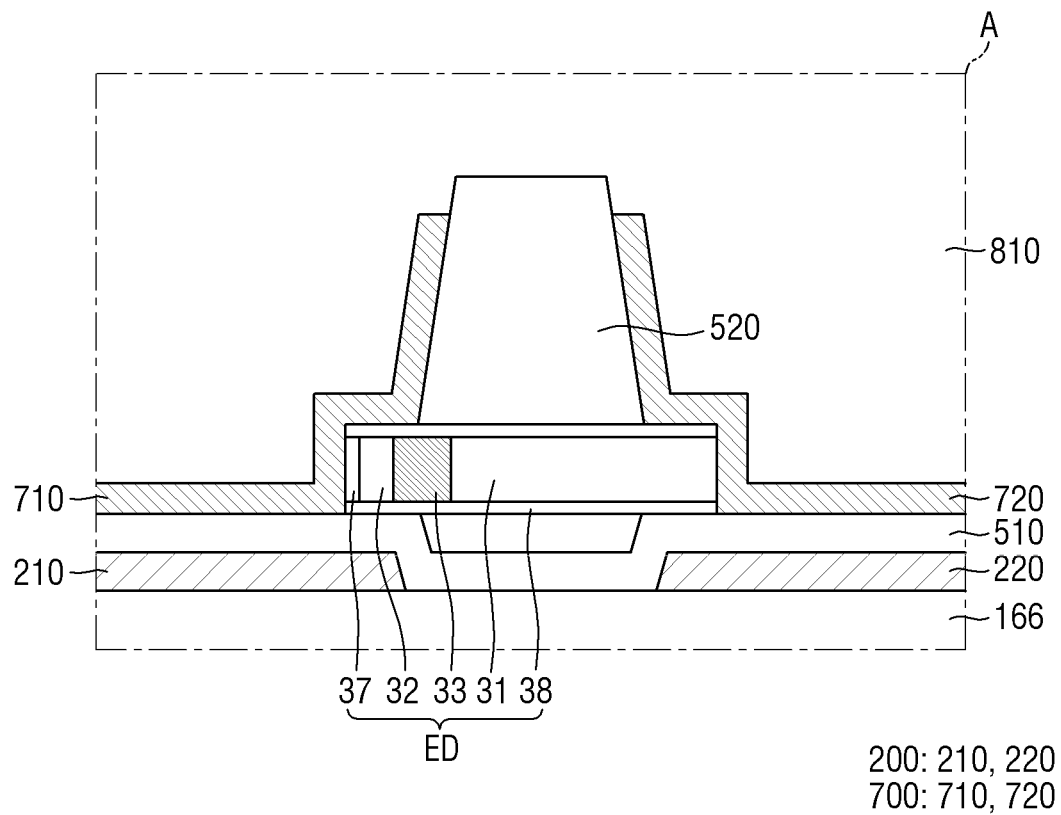
FIG. 7 is an enlarged cross-sectional view illustrating an example of the area A of FIG. 5.

FIG. 7 is an enlarged cross-sectional view illustrating an example of the area A of FIG. 5.

Referring to FIGS. 6 and 7, the light emitting element ED may be disposed so that an extension direction of the light emitting element ED is parallel to one surface of the substrate SUB. The plurality of semiconductor layers included in the light emitting element ED may be sequentially disposed along a direction parallel to an upper surface of the substrate SUB. For example, the first semiconductor layer 31, the element active layer 33, and the second semiconductor layer 32 of the light emitting element ED may be sequentially disposed to be parallel to the upper surface of the substrate SUB.

In the light emitting element ED, in a cross section crossing both ends of the light emitting element ED, the first semiconductor layer 31, the element active layer 33, the second semiconductor layer 32, and the element electrode layer 37 may be sequentially formed in the direction horizontal to the upper surface of the substrate SUB.

The light emitting element ED may be disposed so that one end thereof is on the first electrode 210 and the other end thereof is on the second electrode 220. However, the present disclosure is not limited thereto, and the light emitting element ED may be disposed so that one end thereof is on the second electrode 220 and the other end thereof is on the first electrode 210.

The second insulating layer 520 may be disposed on the light emitting element ED. The second insulating layer 520 may be disposed to surround an outer surface of the light emitting element ED. In an area at where the light emitting element ED is disposed, the second insulating layer 520 may be disposed to surround the outer surface of the light emitting element ED, and in an area at where the light emitting element ED is not disposed, the second insulating layer 520 may be disposed on the first insulating layer 510 exposed by the light emitting element ED.

The first contact electrode 710 may contact one end of the light emitting element ED exposed by the second insulating layer 520. For example, the first contact electrode 710 may be disposed to surround one end surface of the light emitting element ED exposed by the second insulating layer 520. The first contact electrode 710 may contact the element insulating film 38 and the element electrode layer 37 of the light emitting element ED.

The second contact electrode 720 may contact the other end of the light emitting element ED exposed by the second insulating layer 520. For example, the second contact electrode 720 may be disposed to surround the other end surface of the light emitting element ED exposed by the second insulating layer 520. The second contact electrode 720 may contact the element insulating film 38 and the first semiconductor layer 31 of the light emitting element ED.

The first contact electrode 710 and the second contact electrode 720 may be spaced apart from each other with the second insulating layer 520 interposed therebetween. The first contact electrode 710 and the second contact electrode 720 may expose at least a portion of an upper surface of the second insulating layer 520.

The first contact electrode 710 and the second contact electrode 720 may be formed on the same layer and may include the same material. For example, the first contact electrode 710 and the second contact electrode 720 may be simultaneously formed through one mask process. Accordingly, an additional mask process for forming the first contact electrode 710 and the second contact electrode 720 may be omitted, and thus, manufacturing process efficiency of the display device 10 may be improved.

Figure 8:
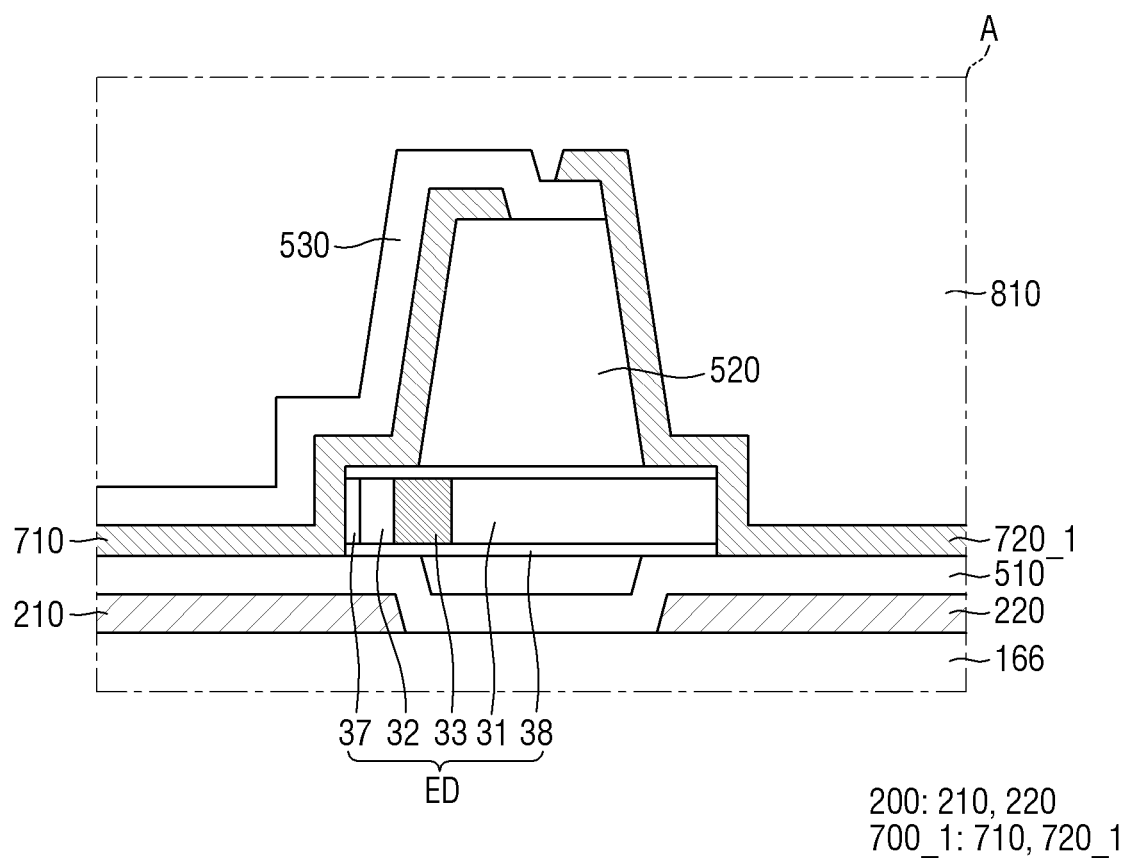
FIG. 8 is an enlarged cross-sectional view illustrating the area A of FIG. 5 according to another embodiment.

FIG. 8 is an enlarged cross-sectional view illustrating the area A of FIG. 5 according to another embodiment.

Referring to FIG. 8, a display device 10 according to the embodiment is different from the display device 10 according to the embodiment described above with reference to FIG. 7 in that a contact electrode 700_1 includes a first contact electrode 710 and a second contact electrode 720_1 formed on different layers and a light emitting element layer EML further includes a third insulating layer 530.

The contact electrode 700_1 may include the first contact electrode 710 and the second contact electrode 720_1 formed on the different layers.

The first contact electrode 710 may be disposed on the first electrode 210 and one end of the light emitting element ED. The first contact electrode 710 may extend from one end of the light emitting element ED toward the second insulating layer 520 to be also disposed on one sidewall of the second insulating layer 520 and an upper surface of the second insulating layer 520. The first contact electrode 710 may be disposed on the upper surface of the second insulating layer 520 but may expose at least a portion of the upper surface of the second insulating layer 520.

The third insulating layer 530 may be disposed on the first contact electrode 710. The third insulating layer 530 may be disposed to completely cover the first contact electrode 710. The third insulating layer 530 may be disposed to completely cover one sidewall and the upper surface of the second insulating layer 520 but may not be disposed on the other sidewall of the second insulating layer 520. One end of the third insulating layer 530 may be aligned with the other sidewall of the second insulating layer 520.

The second contact electrode 720_1 may be disposed on the second electrode 220 and the other end of the light emitting element ED. The second contact electrode 720_1 may extend from the other end of the light emitting element ED toward the second insulating layer 520 to be also disposed on the other sidewall of the second insulating layer 520 and an upper surface of the third insulating layer 530.

In the embodiment, a process of the display device 10 is added by forming the first contact electrode 710 and the second contact electrode 720_1 on the different layers and interposing the third insulating layer 530 between the first contact electrode 710 and the second contact electrode 720_1 such that the manufacturing process efficiency of the display device 10 may decrease but reliability of the display device 10 may be improved. For example, a problem that the first contact electrode 710 and the second contact electrode 720_1 are short-circuited in the process of manufacturing the display device 10 may be reduced or minimized by forming the first contact electrode 710 and the second contact electrode 720_1 on the different layers and further disposing the third insulating layer 530 between the first contact electrode 710 and the second contact electrode 720_1.

Hereinafter, other embodiments of a display device will be described with reference to other drawings.

Figure 9:
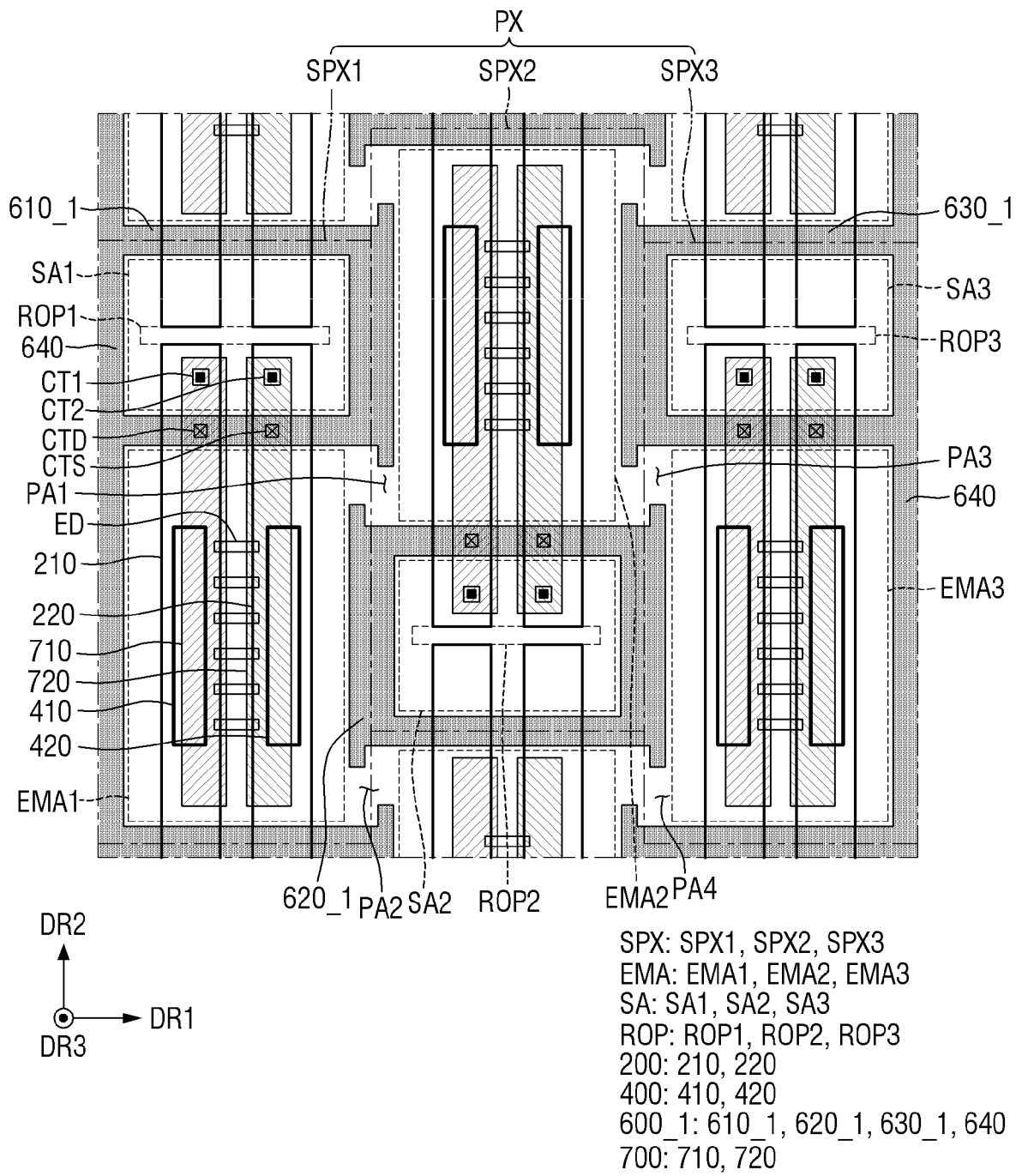
FIG. 9 is a schematic plan layout view of one pixel according to an embodiment.

FIG. 9 is a schematic plan layout view of one pixel according to another embodiment.

Referring to FIG. 9, a display device 10 according to this embodiment is different from the display device 10 according to the embodiment described above with reference to FIG. 4 in that first to third walls 610_1, 620_1, and 630_1 have protrusion parts protruding from partial areas of the first to third walls 610_1, 620_1, and 630_1 in the second direction DR2.

As shown in FIG. 9, the first to third walls 610_1, 620_1, and 630_1 may further include protrusion parts protruding upwardly or downwardly in a plan view, respectively.

The first wall 610_1 may further include a protrusion part protruding toward the second wall 620_1 at a boundary between the first sub-pixel SPX1 and the second sub-pixel SPX2. A width of the protrusion part in the first direction DR1 may be smaller than a width of the longitudinal portion of the first 610_1 in the first direction DR1.

Similarly, the second wall 620_1 may further include protrusion parts protruding toward the wall 610_1 or the third wall 630_1 at the boundary between the first sub-pixel SPX1 and the second sub-pixel SPX2 and at a boundary between the second sub-pixel SPX2 and the third sub-pixel SPX3. A width of the protrusion part in the first direction DR1 may be smaller than a width of the longitudinal portion of the second wall 620_1 in the first direction DR1.

The third wall 630_1 may further include a protrusion part protruding toward the second wall 620_1 at the boundary between the second sub-pixel SPX2 and the third sub-pixel SPX3. A width of the protrusion part in the first direction DR1 may be smaller than a width of the longitudinal portion of the third wall 630_1 in the first direction DR1.

Even though the first to third walls 610_1, 620_1, and 630_1 further include the protrusion parts protruding in the second direction DR2 in boundary areas between the sub-pixels SPX, the respective protrusion parts of the first to third walls 610_1, 620_1, and 630_1 may be spaced apart from each other. Accordingly, the ink jetted into the emission area EMA may flow to the other emission areas EMA through areas between the first to third walls 610_1, 620_1 and 630_1 spaced apart from each other, for example, the first to fourth passages PA1, PA2, PA3, and PA4.

The protrusion parts of the first to third walls 610_1, 620_1, and 630_1 may adjust widths or shapes, in a plan view, of the above-described passages PA1, PA2, PA3, and PA4. For example, widths of the passages PA1, PA2, PA3, and PA4 in the second direction DR2 may be adjusted by adjusting lengths of the protrusion parts of the first to third walls 610_1, 620_1, and 630_1. Accordingly, during the process for aligning the light emitting elements ED, the ink jetted into each emission area EMA is induced to flow from one emission area EMA to the other emission areas EMA through the passages PA1, PA2, PA3, and PA4, but the movement of the plurality of light emitting elements ED dispersed in the ink from one emission area EMA to the other emission areas EMA through the passages PA1, PA2, PA3, and PA4 is may be prevented or substantially prevented. Accordingly, a display quality of the display device 10 may be improved by reducing or minimizing a deviation between the numbers of light emitting elements ED aligned in the emission areas EMA of the respective sub-pixels SPX.

Figure 10:
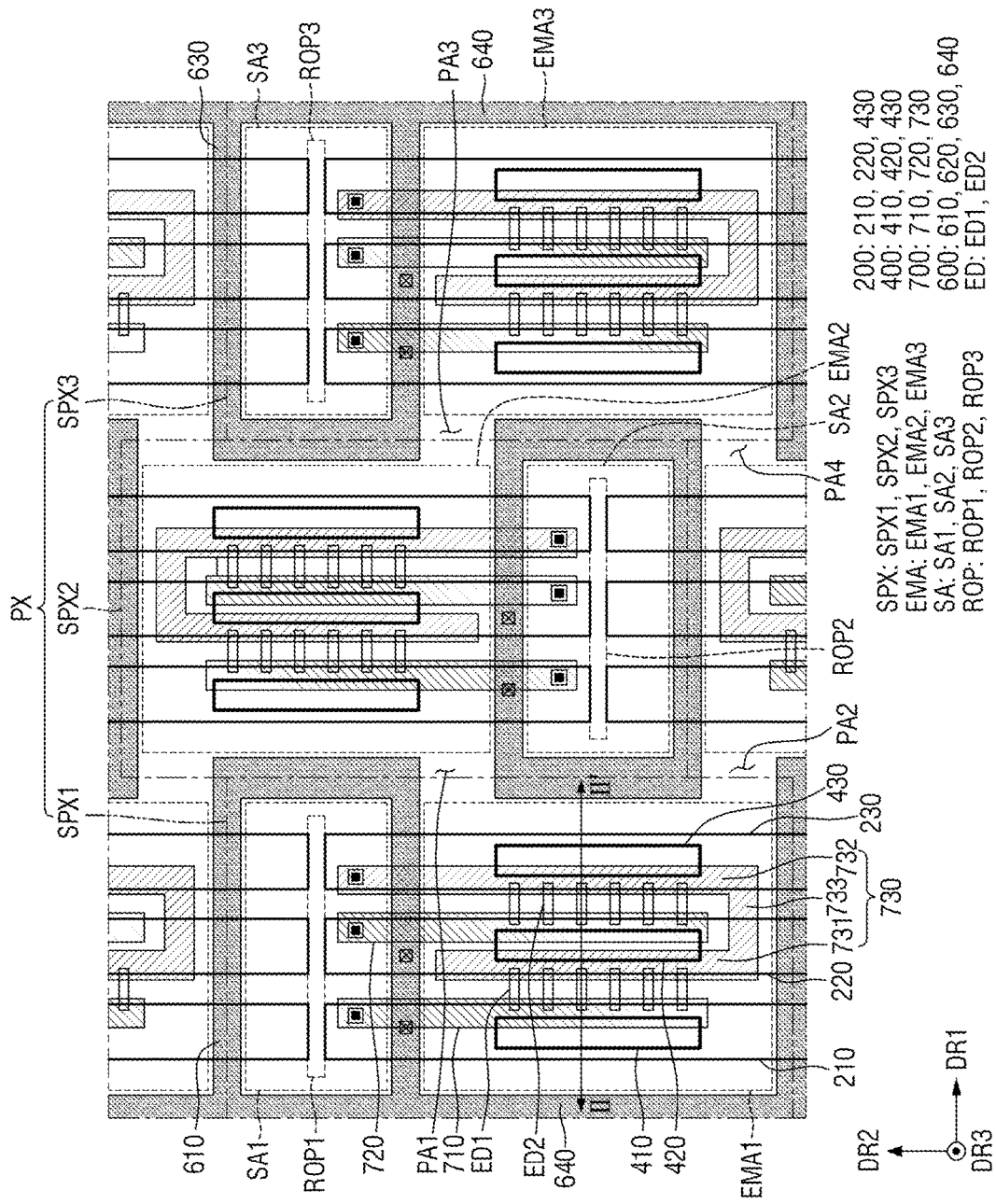
FIG. 10 is a schematic plan layout view of one pixel according to an embodiment.

FIG. 10 is a schematic plan layout view of one pixel according to an embodiment.

Referring to FIG. 10, a display device 10 according to this embodiment is different from the display device 10 illustrated in FIG. 4 in that the electrode layer 200 further includes a third electrode 230, the second bank 400 further includes a third sub-bank 430, and the contact electrode 700 further includes a third contact electrode 730, in each sub-pixel SPX included in the display device 10.

As shown in FIG. 10, the electrode layer 200 disposed in each sub-pixel SPX may further include the third electrode 230 spaced apart from each of the first electrode 210 and the second electrode 220. The third electrode 230 may be spaced apart from the first electrode 210 with the second electrode 220 interposed therebetween in the first direction DR1 and may be spaced apart from the second electrode 220 in the first direction DR1.

The third electrode 230 may be disposed over the emission area EMA and the sub-area SA of each sub-pixel SPX. The third electrode 230 may have a shape in which it extends in the second direction DR2 in a plan view. Similar to the first electrode 210 and the second electrode 220, the third electrode 230 may be disposed over the emission area EMA and the sub-area SA of each sub-pixel SPX but may be spaced apart from a third electrode 230 included in a sub-pixel SPX neighboring in the second direction DR2 at a separation part ROP positioned in the sub-area SA. The third electrode 230 may not be electrically connected to the circuit element layer CCL, different from the first electrode 210 and the second electrode 220.

The second bank 400 may further include the third sub-bank 430 spaced apart from the first sub-bank 410 and the second sub-bank 420. The third sub-bank 430 may be spaced apart from the first sub-bank 410 with the second sub-bank 420 interposed therebetween in the first direction DR1 and may be spaced apart from the second sub-bank 420 in the first direction DR1. The third sub-bank 430 may be disposed to overlap the third electrode 230 in the third direction DR3 in the emission area EMA of each sub-pixel SPX.

The plurality of light emitting elements ED may be disposed between a plurality of sub-banks 410, 420, and 430 in the emission area EMA. The plurality of light emitting elements ED may include a plurality of first light emitting elements ED1 disposed between the first sub-bank 410 and the second sub-bank 420 and a plurality of second light emitting elements ED2 disposed between the second sub-bank 420 and the third sub-bank 430.

The plurality of first light emitting elements ED1 may be disposed so that at least one ends thereof are on the first electrode 210 or the second electrode 220 in an area in which the first sub-bank 410 and the second sub-bank 420 are spaced apart from and face each other. The plurality of second light emitting elements ED2 may be disposed so that at least one ends thereof are on the second electrode 220 or the third electrode 230 in an area in which the second sub-bank 420 and the third sub-bank 430 are spaced apart from and face each other.

The plurality of first light emitting elements ED1 disposed between the first sub-bank 410 and the second sub-bank 420 may be connected to each other in parallel, and the plurality of second light emitting elements ED2 disposed between the second sub-bank 420 and the third sub-bank 430 may be connected to each other in parallel. The first light emitting element ED1 and the second light emitting element ED2 may be connected to each other in series. The first light emitting element ED1 and the second light emitting element ED2 may be connected to each other in series through a third contact electrode 730, to be described later.

The contact electrode 700 may further include the third contact electrode 730 spaced apart from the first contact electrode 710 and the second contact electrode 720.

The first contact electrode 710 may be disposed to overlap the first electrode 210 in the third direction DR3 in the emission area EMA and the sub-area SA of each sub-pixel SPX. The first contact electrode 710 may be disposed to overlap one end of the plurality of first light emitting elements ED1 in the emission area EMA of each sub-pixel SPX. The first contact electrode 710 may have a shape in which it extends in the second direction DR2 in a plan view.

The second contact electrode 720 may be disposed to overlap the second electrode 220 in the third direction DR3 in the emission area EMA and the sub-area SA of each sub-pixel SPX. The second contact electrode 720 may be disposed to overlap one end of the plurality of second light emitting elements ED2 in the emission area EMA of each sub-pixel SPX. The second contact electrode 720 may have a shape in which it extends in the second direction DR2 in a plan view.

The third contact electrode 730 may be disposed to be spaced apart from the first contact electrode 710 and the second contact electrode 720. The third contact electrode 730 may have a first area 731, a second area 732, and a third area 733.

The first area 731 of the third contact electrode 730 may be disposed in the emission area EMA of each sub-pixel SPX. The first area 731 of the third contact electrode 730 may have a shape in which it extends in the second direction DR2 in a plan view in the emission area EMA of each sub-pixel SPX.

The first area 731 of the third contact electrode 730 may be disposed to overlap the second electrode 220 in the third direction DR3 in the emission area EMA of each sub-pixel SPX. The first area 731 of the third contact electrode 730 may be disposed to overlap the other ends of the plurality of first light emitting elements ED1 in the emission area EMA of each sub-pixel SPX.

The second area 732 of the third contact electrode 730 may be disposed over the emission area EMA and the sub-area SA of each sub-pixel SPX. The second area 732 of the third contact electrode 730 may have a shape in which it extends in the second direction DR2 in a plan view.

The second area 732 of the third contact electrode 730 may be spaced apart from the first area 731 of the third contact electrode 730 in the first direction DR1. The second area 732 of the third contact electrode 730 may be disposed to overlap the third electrode 230 in the third direction DR3 in the emission area EMA and the sub-area SA of each sub-pixel SPX. The second area 732 of the third contact electrode 730 may be disposed to overlap the other end of the plurality of second light emitting elements ED2 in the emission area EMA of each sub-pixel SPX. The second area 732 of the third contact electrode 730 may contact the third electrode 230 through a third contact part CT3 in the sub-area SA of each sub-pixel SPX. The second area 732 of the third contact electrode 730 and the third electrode 230 contact each other through the third contact part CT3 such that the occurrence of a parasitic capacitance between the second area 732 of the third contact electrode 730 and the third electrode 230 may be reduced or minimized.

The third area 733 of the third contact electrode 730 may be disposed between the first area 731 of the third contact electrode 730 and the second area 732 of the third contact electrode 730. The third area 733 of the third contact electrode 730 may be disposed between the first area 731 of the third contact electrode 730 and the second area 732 of the third contact electrode 730 to connect the first area 731 of the third contact electrode 730 and the second area 732 of the third contact electrode 730 to each other.

Figure 11:
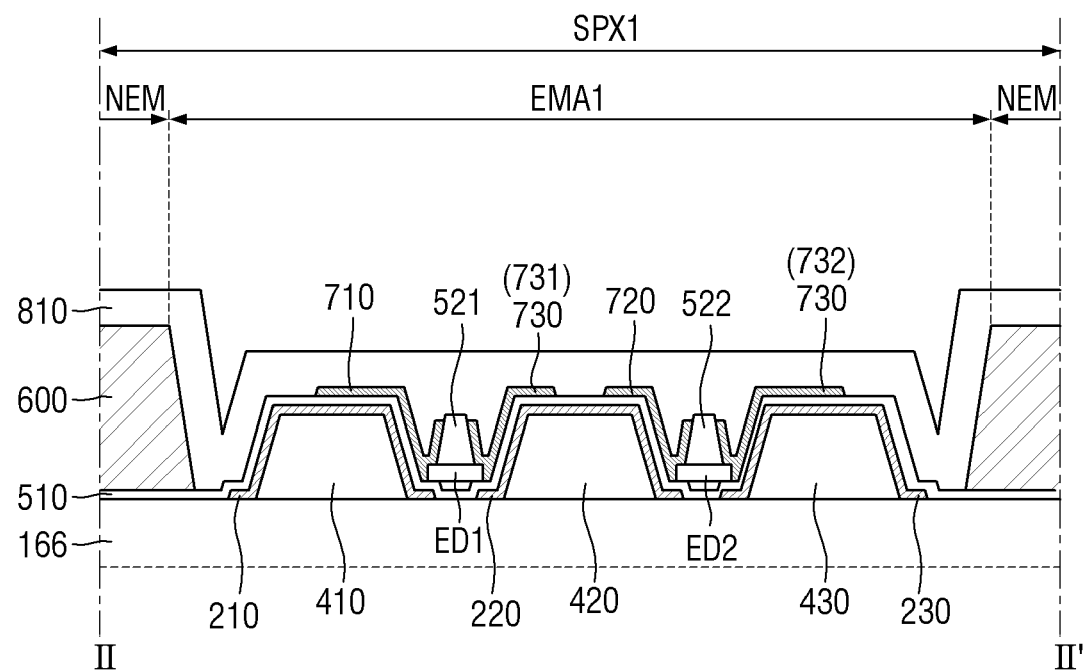
FIG. 11 is a cross-sectional view illustrating an example taken along the line II-II' of FIG. 10.

FIG. 11 is a cross-sectional view illustrating an example taken along the line II-II' of FIG. 10.

Hereinafter, a schematic cross-sectional structure of the first sub-pixel SPX1 of the display device 10 illustrated in FIG. 10 will be described. The schematic cross-sectional structure of the first sub-pixel SPX1 may be similarly applied to the second sub-pixel SPX2 and the third sub-pixel SPX3. Accordingly, a description for cross-sectional structures of the second sub-pixel SPX2 and the third sub-pixel SPX3 will be replaced with a description of the cross-sectional structures of the first sub-pixel SPX1.

Referring to FIGS. 10 and 11, the second bank 400 may be directly disposed on the via layer 166. The first to third sub-banks 410, 420, and 430 may be disposed to be spaced apart from each other along the first direction DR1 on the via layer 166.

The electrode layer 200 may be disposed on the second bank 400. For example, the first electrode 210 may be disposed on the first sub-bank 410, the second electrode 220 may be disposed on the second sub-bank 420, and the third electrode 230 may be disposed on the third sub-bank 430.

The first insulating layer 510 may be disposed on the electrode layer 200. The first insulating layer 510 may be disposed to cover the first to third electrodes 210, 220, and 230 in the first emission area EMA1. The first insulating layer 510 may further include the third contact part CT3 exposing at least a portion of the third electrode 230 in the first sub-area SA1. The second area 732 of the third contact electrode 730 and the third electrode 230 may be electrically connected to each other through the third contact part CT3 penetrating through the first insulating layer 510.

The first light emitting element ED1 and the second light emitting element ED2 may be disposed on the first insulating layer 510 in the first emission area EMA1. The first light emitting element ED1 may be disposed between the first sub-bank 410 and the second sub-bank 420 in the first emission area EMA1, and the second light emitting element ED2 may be disposed between the second sub-bank 420 and the third sub-bank 430 in the first emission area EMA1. For example, the first light emitting element ED1 and the second light emitting element ED2 may be disposed to be spaced apart from each other with the second sub-bank 420 interposed therebetween. The first light emitting element ED1 may be disposed so that both ends thereof are on the first electrode 210 and the second electrode 220, respectively, and the second light emitting element ED2 may be disposed so that both ends thereof are on the second electrode 220 and the third electrode 230, respectively.

The second insulating layer 520 may be disposed on the light emitting element ED. The second insulating layer 520 may include a first insulating pattern 521 and a second insulating pattern 522.

The first insulating pattern 521 may be disposed on the first light emitting element ED1. The first insulating pattern 521 may be disposed to partially cover an outer surface of the first light emitting element ED1 but may be disposed so as not to cover both ends of the first light emitting element ED1.

The second insulating pattern 522 may be disposed on the second light emitting element ED2. The second insulating pattern 522 may be disposed to partially cover an outer surface of the second light emitting element ED2 but may be disposed so as not to cover both ends of the second light emitting element ED2.

The first contact electrode 710 may be disposed on the first electrode 210. The first contact electrode 710 may contact one end of the first light emitting element ED1 exposed by the first insulating pattern 521 of the second insulating layer 520. The first contact electrode 710 may be electrically connected to the first electrode 210 through the first contact part CT1. The first contact electrode 710 may contact each of one end of the first light emitting element ED1 and the first electrode 210 to electrically connect the first electrode 210 and one end of the first light emitting element ED1 to each other.

The second contact electrode 720 may be disposed on the second electrode 220. The second contact electrode 720 may contact one end of the second light emitting element ED2 exposed by the second insulating pattern 522 of the second insulating layer 520. The second contact electrode 720 may be electrically connected to the second electrode 220 through the second contact part CT2. The second contact electrode 720 may contact each of one end of the second light emitting element ED2 and the second electrode 220 to electrically connect the second electrode 220 and one end of the second light emitting element ED2 to each other.

The first area 731 of the third contact electrode 730 may be disposed on the second electrode 220. The first area 731 of the third contact electrode 730 may be spaced apart from the first contact electrode 710 with the first insulating pattern 521 of the second insulating layer 520 interposed therebetween. The first area 731 of the third contact electrode 730 may be spaced apart from the second contact electrode 720 on the second electrode 220. The first area 731 of the third contact electrode 730 may be in contact with the other end of the first light emitting element ED1 exposed by the first insulating pattern 521 of the second insulating layer 520.

The second area 732 of the third contact electrode 730 may be disposed on the third electrode 230. The second area 732 of the third contact electrode 730 may be spaced apart from the second contact electrode 720 with the second insulating pattern 522 of the second insulating layer 520 interposed therebetween. The second area 732 of the third contact electrode 730 may be in contact with the other end of the second light emitting element ED2 exposed by the second insulating pattern 522 of the second insulating layer 520.

The first contact electrode 710 may contact each of the first electrode 210 and one end of the first light emitting element ED1 to electrically connect the first electrode 210 and the first light emitting element ED1 to each other. The second contact electrode 720 may contact each of the second electrode 220 and one end of the second light emitting element ED2 to electrically connect the second electrode 220 and the second light emitting element ED2 to each other. The third contact electrode 730 may contact each of the other end of the first light emitting element ED1 and the other end of the second light emitting element ED2 to connect the first light emitting element ED1 and the second light emitting element ED2 to each other in series.

Figure 12:
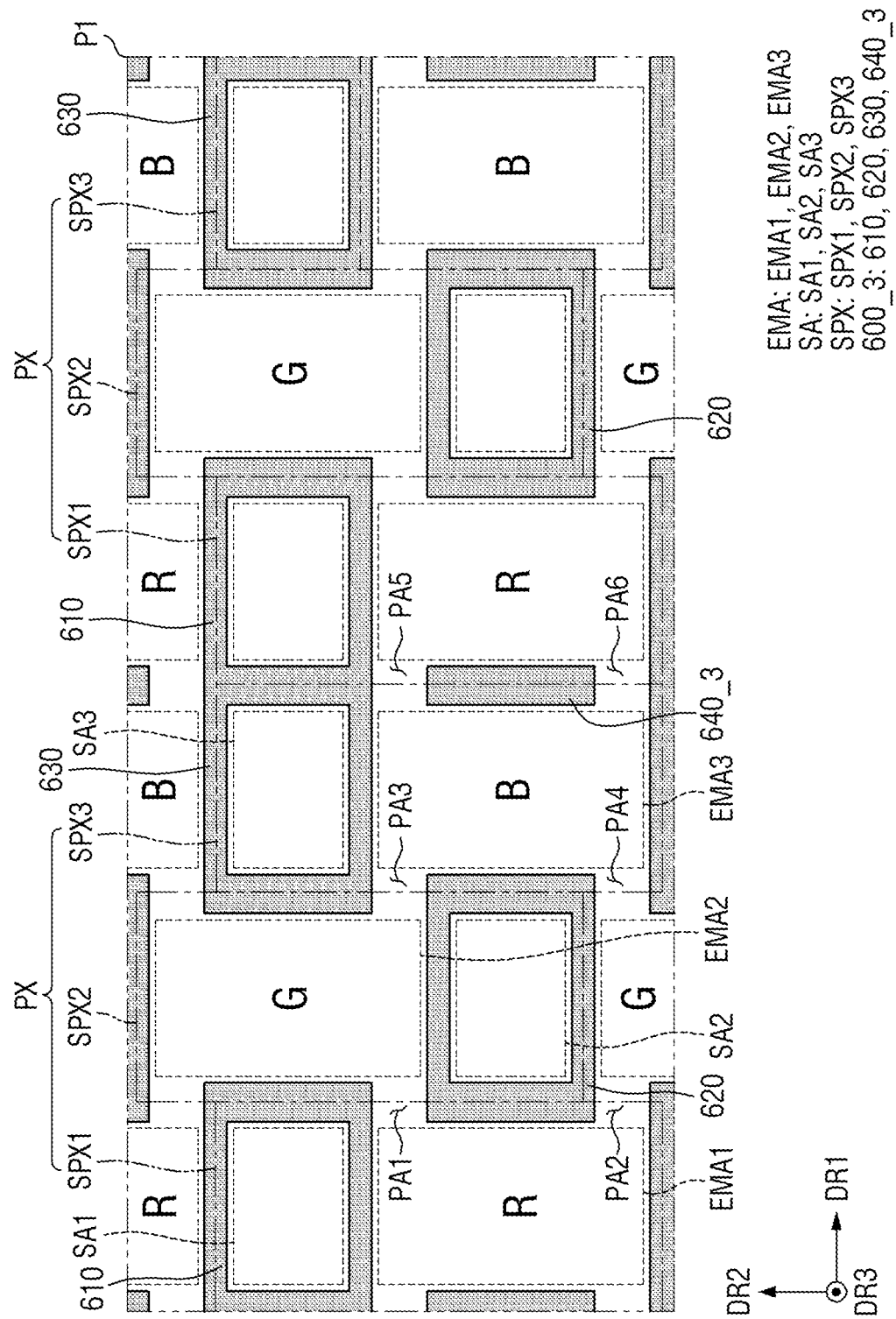
FIG. 12 is an enlarged view illustrating an example of a relative layout, in a plan view, of an emission area, a sub-area, and a first bank disposed in the area P1 of FIG. 2 according to another embodiment.

FIG. 12 is an enlarged view illustrating a relative layout, in a plan view, of an emission area, a sub-area, and a first bank disposed in the area P1 of FIG. 2 according to another embodiment.

Referring to FIG. 12, this embodiment is different from the embodiment described above with reference to FIG. 3 in that a fourth wall 640_3 included in a first bank 600_3 is spaced apart from the first and third walls 610 and 630 disposed on the upper side and the lower side of the fourth wall 640_3.

The fourth wall 640_3 may be disposed at a boundary between the respective pixels PX adjacent to each other in the first direction DR1. The fourth wall 640_3 may be disposed at a boundary between the first emission area EMA1 and the third emission area EMA3 of the respective pixels PX disposed adjacent to each other in the first direction DR1. The fourth wall 640_3 may be disposed adjacent to the third emission area EMA3 and the first emission area EMA1 on the right side of the third emission area EMA3 and the left side of the first emission area EMA1 and may expose portions of the third emission area EMA3 and the first emission area EMA1 in the first direction DR1.

The fourth wall 640_3 may be spaced apart from the first wall 610 and the third wall 630 that are integrated with each other and formed as one pattern. For example, a length of the fourth wall 640_3 in the second direction DR2 may be smaller than widths of the first emission area EMA1 and the third emission area EMA3 in the second direction DR2. The length of the fourth wall 640_3 in the second direction DR2 is smaller than the width of the first emission area EMA1 in the second direction DR2 and the width of the third emission area EMA3 in the second direction DR2 such that the fourth wall 640_3 may be spaced apart from the first walls 610 and the third walls 630 each disposed on the upper side and the lower side of the first emission area EMA1 and the third emission area EMA3 in the second direction DR2. Accordingly, fifth and sixth passages PA5 and PA6 defined as areas between the first and third walls 610 and 630 and the fourth wall 640_3 may be formed between the third emission area EMA3 of one pixel PX and the first emission area EMA1 of another pixel PX disposed on the right side of the one pixel PX.

In the embodiment, the length of the fourth wall 640_3 in the second direction DR2 is smaller than the width of the first emission area EMA1 in the second direction DR2 and the width of the third emission area EMA3 in the second direction DR2, such that the fifth and sixth passages PA5 and PA6 may be formed between the third emission area EMA3 and the first emission area EMA1. Accordingly, ink jetted into each of the first emission area EMA1 and the third emission area EMA3 of the pixels PX neighboring in the first direction DR1 may flow to emission areas EMA of different pixels PX through the fifth and sixth passages PA5 and PA6. The ink jetted into each of the first and third emission areas EMA1 and EMA3 is induced to flow from the emission area EMA of one pixel PX to the emission area EMA of another pixel PX through the fifth and sixth passages PA5 and PA6, such that a surface shape of the ink jetted into the emission areas EMA may be flat at an upper side or a lower side of each emission area EMA. Accordingly, it is possible to more effectively prevent the light emitting elements aligned during the process for aligning the light emitting elements from being collected upward and downward in the emission areas EMA due to the shape of the ink.

Figure 13:
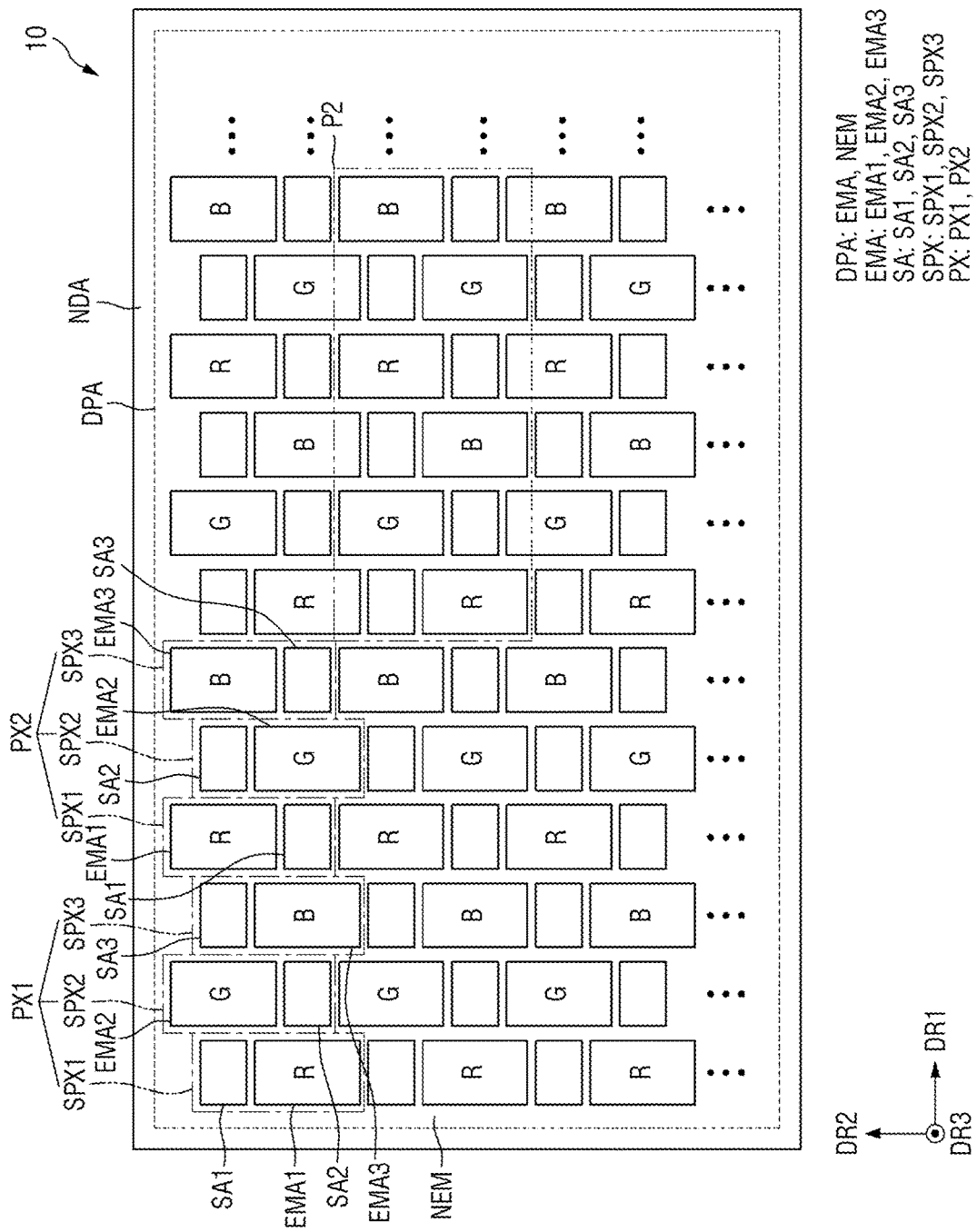
FIG. 13 is a schematic layout view illustrating a layout of emission areas and sub-areas of a display device according to an embodiment.

FIG. 13 is a schematic layout view illustrating a layout of emission areas and sub-areas of a display device according to an embodiment.

Referring to FIG. 13, a display device 10 according to this embodiment is different from the display device 10 described above with reference to FIG. 2 in that it includes first pixels PX1 and second pixels PX2 of which arrangement directions of emission areas EMA and sub-areas SA are opposite to each other.

The pixels PX may include first pixels PX1 and second pixels PX2 disposed adjacent to each other in the first direction DR1. Each of the first pixel PX1 and the second pixel PX2 may include an emission area EMA and a sub-area SA, and an arrangement direction of the emission area EMA and the sub-area SA of the first pixel PX1 may be opposite to an arrangement direction of the emission area EMA and the sub-area SA of the second pixel PX2.

An arrangement of the emission area EMA and the sub-area SA of the first pixel PX1 may be substantially the same as that of the pixel PX described with reference to FIG. 2. For example, a first sub-area SA1 included in a first sub-pixel SPX1 of the first pixel PX1 may be disposed on the upper side of a first emission area EMA1, a second sub-area SA2 included in a second sub-pixel SPX2 of the first pixel PX1 may be disposed on the lower side of a second emission area EMA2, and a third sub-area SA3 included in a third sub-pixel SPX3 of the first pixel PX1 may be disposed on the upper side of a third emission area EMA3.

An arrangement of the emission area EMA and the sub-area SA of the second pixel PX2 may be opposite to that of the first pixel PX in the second direction DR2. For example, a first sub-area SA1 included in a first sub-pixel SPX1 of the second pixel PX2 may be disposed on the lower side of a first emission area EMA1, a second sub-area SA2 included in a second sub-pixel SPX2 of the second pixel PX2 may be disposed on the upper side of a second emission area EMA2, and a third sub-area SA3 included in a third sub-pixel SPX3 of the second pixel PX2 may be disposed on the lower side of a third emission area EMA3.

The first sub-area SA1, the second emission area EMA2, and the third sub-area SA3 of the first pixel PX1 and the first emission area EMA1, the second sub-area SA2, and the third emission area EMA3 of the second pixel PX2 may be arranged side-by-side in the first direction DR1 in the same row. Similarly, the first emission area EMA1, the second sub-area SA2, and the third emission area EMA3 of the first pixel PX1 and the first sub-area SA1, the second emission area EMA2, and the third sub-area SA3 of the second pixel PX2 may be arranged side-by-side in the first direction DR1 in the same row.

Figure 14:
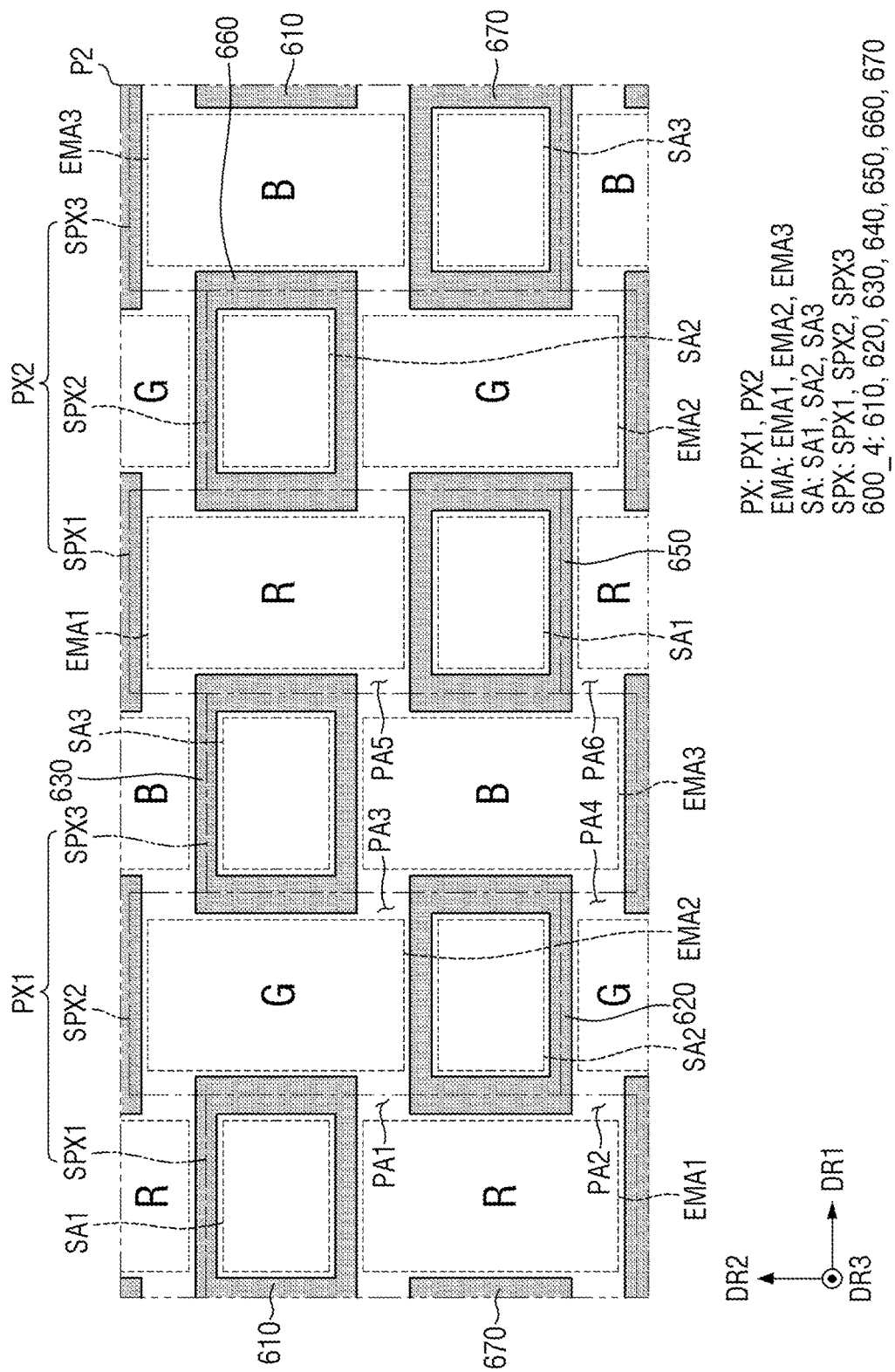
FIG. 14 is an enlarged view illustrating an example of a relative layout, in a plan view, of an emission area, a sub-area, and a first bank disposed in the area P2 of FIG. 13.
Figure 15:
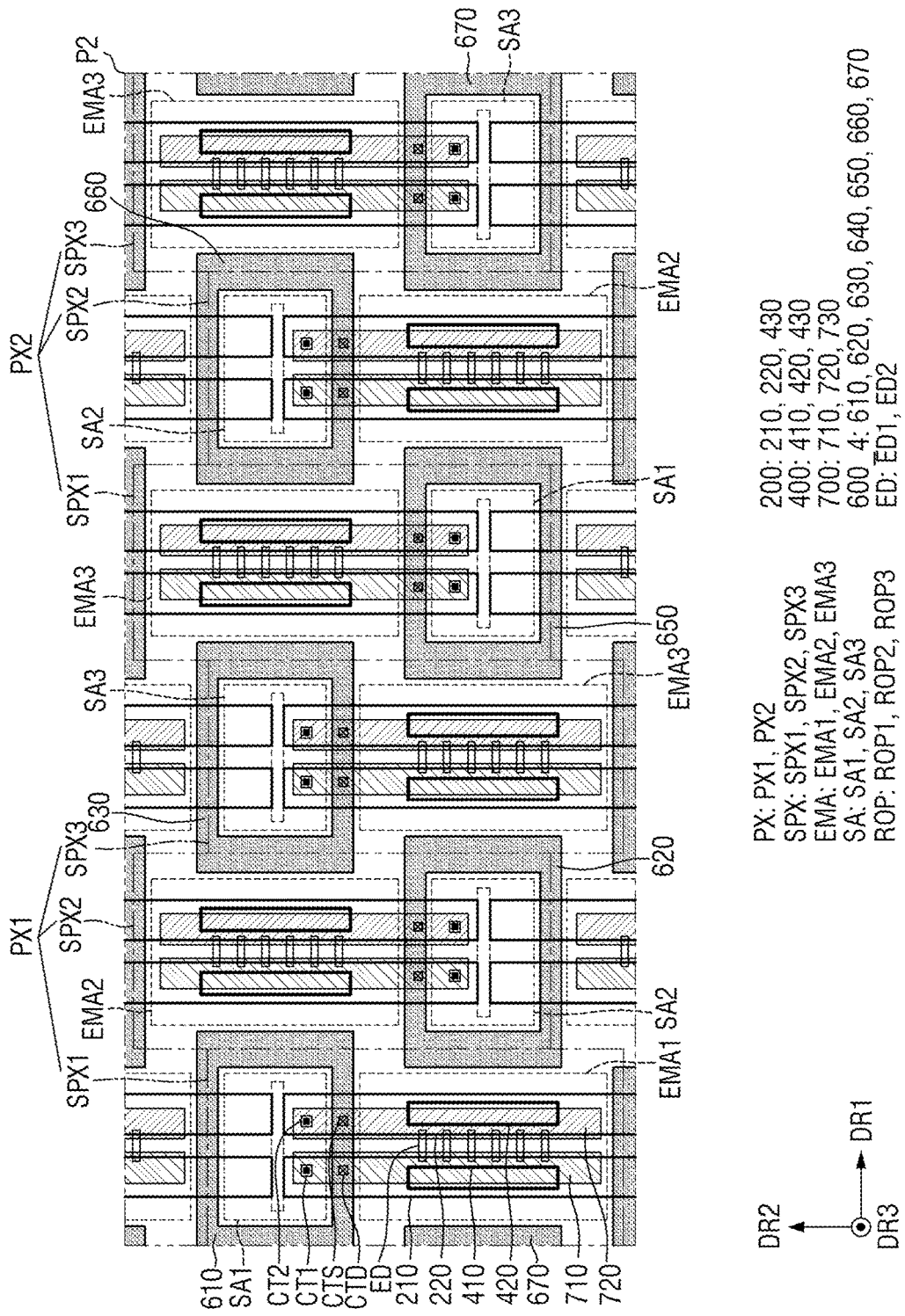
FIG. 15 is a schematic plan layout view of a first pixel and a second pixel according to the embodiment shown in FIG. 14.

FIG. 14 is an enlarged view illustrating an example of a relative layout, in a plan view, of an emission area, a sub-area, and a first bank disposed in the area P2 of FIG. 13, and FIG. 15 is a schematic plan layout view of a first pixel and a second pixel according to the embodiment shown in FIG. 14.

Referring to FIGS. 14 and 15, a first bank 600_4 according to this embodiment may include first to third walls 610, 620, and 630 disposed in the first pixel PX1 and fifth to seventh walls 650, 660, and 670 disposed in a second pixel PX2.

The first wall 610 may be disposed to surround the first sub-area SA1 of the first sub-pixel SPX1 included in the first pixel PX1, the second wall 620 may be disposed to surround the second sub-area SA2 of the second sub-pixel SPX2 included in the first pixel PX1, and the third wall 630 may be disposed to surround the third sub-area SA3 of the third sub-pixel SPX3 included in the first pixel PX1.

The fifth wall 650 may be disposed to surround the first sub-area SA1 of the first sub-pixel SPX1 included in the second pixel PX2, the sixth wall 660 may be disposed to surround the second sub-area SA2 of the second sub-pixel SPX2 included in the second pixel PX2, and the seventh wall 670 may be disposed to surround the third sub-area SA3 of the third sub-pixel SPX3 included in the second pixel PX2.

The first to third walls 610, 620, and 630 and the fifth to seventh walls 650, 660, and 670 may be disposed to be spaced apart from each other. For example, the first wall 610, the third wall 630, and the sixth wall 660 may be arranged side-by-side in the first direction DR1 but may be spaced apart from each other in the first direction DR1. The second wall 620, the fifth wall 650, and the seventh wall 670 may be arranged side-by-side in the first direction DR1 but may be spaced apart from each other in the first direction DR1. The first wall 610, the third wall 630, and the sixth wall 660 may be spaced apart from the second wall 620, the fifth wall 650, and the seventh wall 670 in the second direction DR2.

In an embodiment, the fifth wall 650 surrounding the first sub-area SA1 of the second pixel PX2 may be disposed adjacent to the third wall 630 on the lower right side of the third wall 630 but may be disposed to be spaced apart from the third wall 630 in the second direction DR2. Therefore, passages PA5 and PA6 defined as areas between the third wall 630 and the fifth wall 650 may be further formed between the third emission area EMA3 of the first pixel PX1 and the first emission area EMA1 of the second pixel PX2.

Referring to FIG. 15, because the first sub-area SA1 of the second pixel PX2 is disposed on the lower side of the first emission area EMA1, first and second contact electrodes 710 and 720 disposed in the first sub-pixel SPX1 of the second pixel PX2 may contact first and second electrodes 210 and 220, respectively, in the first sub-area SA1 disposed on the lower side of the first emission area EMA1. Similarly, first and second contact electrodes 710 and 720 disposed in the second sub-pixel SPX2 of the second pixel PX2 may contact first and second electrodes 210 and 220, respectively, in the second sub-area SA2 disposed on the upper side of the second emission area EMA2, and first and second contact electrodes 710 and 720 disposed in the third sub-pixel SPX3 of the second pixel PX2 may contact first and second electrodes 210 and 220, respectively, in the third sub-area SA3 disposed on the lower side of the third emission area EMA3.

In an embodiment, the display device 10 includes the first pixels PX1 and the second pixels PX2 which the arrangement directions of the emission areas EMA and the sub-areas SA are opposite to each other such that the first emission area EMA1 of the second pixel PX2 may be disposed adjacent to the third emission area EMA3 of the first pixel PX1 in a diagonal direction, and the third emission area EMA3 of the second pixel PX2 may be disposed adjacent to the first emission area EMA1 of the first pixel PX1 in a diagonal direction. Accordingly, the emission areas EMA of the sub-pixels SPX disposed adjacent to each other in the first direction DR1 are disposed in a diagonal direction, and thus, ink jetted into the emission areas EMA may more easily flow from one emission area EMA to the other emission areas EMA to more effectively prevent the light emitting elements ED from being collected upward and downward in the emission areas EMA due to the shape of the ink in the process for aligning the light emitting elements ED.

Figure 16:
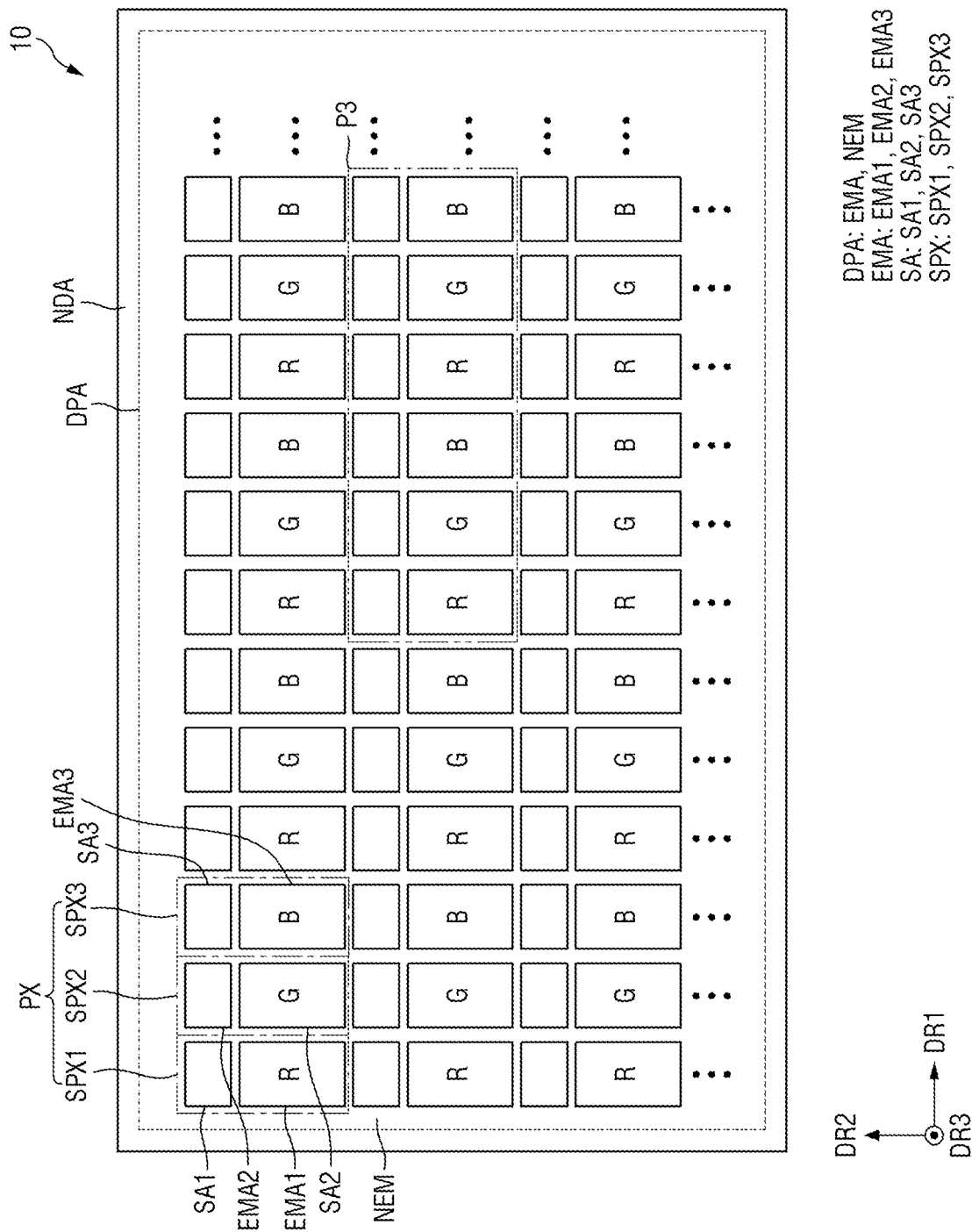
FIG. 16 is a schematic layout view illustrating a layout of emission areas and sub-areas of a display device according to an embodiment.

FIG. 16 is a schematic layout view illustrating a layout of emission areas and sub-areas of a display device according to an embodiment.

Referring to FIG. 16, in a display device 10 according to this embodiment, first to third sub-areas SA1, SA2, and SA3 may be arranged side-by-side in the first direction DR1 in the same row, and first to third emission areas EMA1, EMA2, and EMA3 may be arranged side-by-side in the first direction DR1 in the same row. For example, directions in which emission areas EMA and sub-areas SA of a plurality of sub-pixels SPX included in one pixel PX are arranged may be the same as each other, and directions in which the sub-areas SA are disposed with respect to each of the emission areas EMA of the first to third sub-pixels SPX1, SPX2, and SPX3 may be the same as each other. For example, the first to third sub-areas SA1, SA2, and SA3 may be disposed on the upper sides of the first to third emission areas EMA1, EMA2, and EMA3, respectively.

Figure 17:
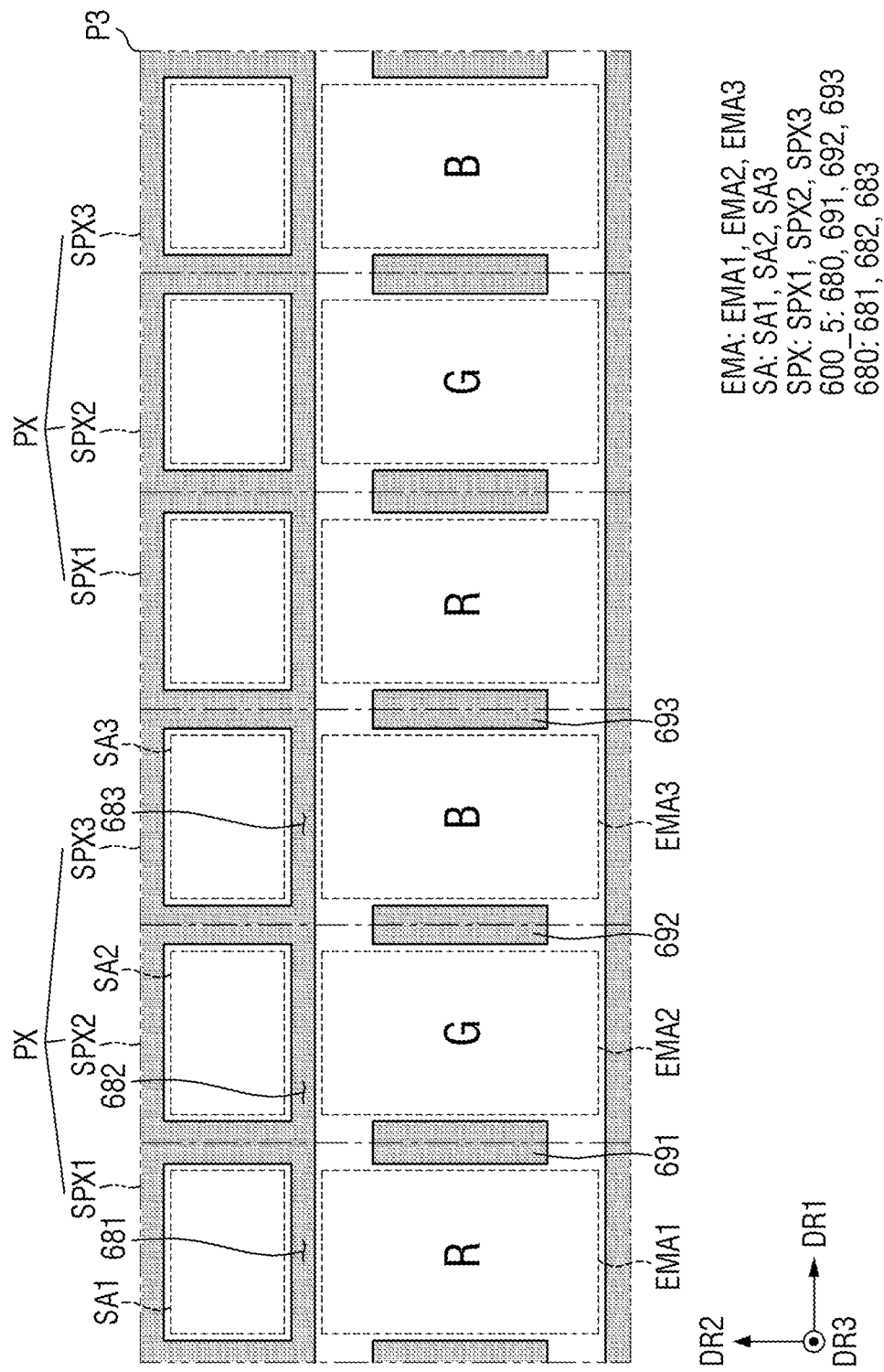
FIG. 17 is an enlarged view illustrating an example of a relative layout, in a plan view, of an emission area, a sub-area, and a first bank disposed in the area P3 of FIG. 16.
Figure 18:
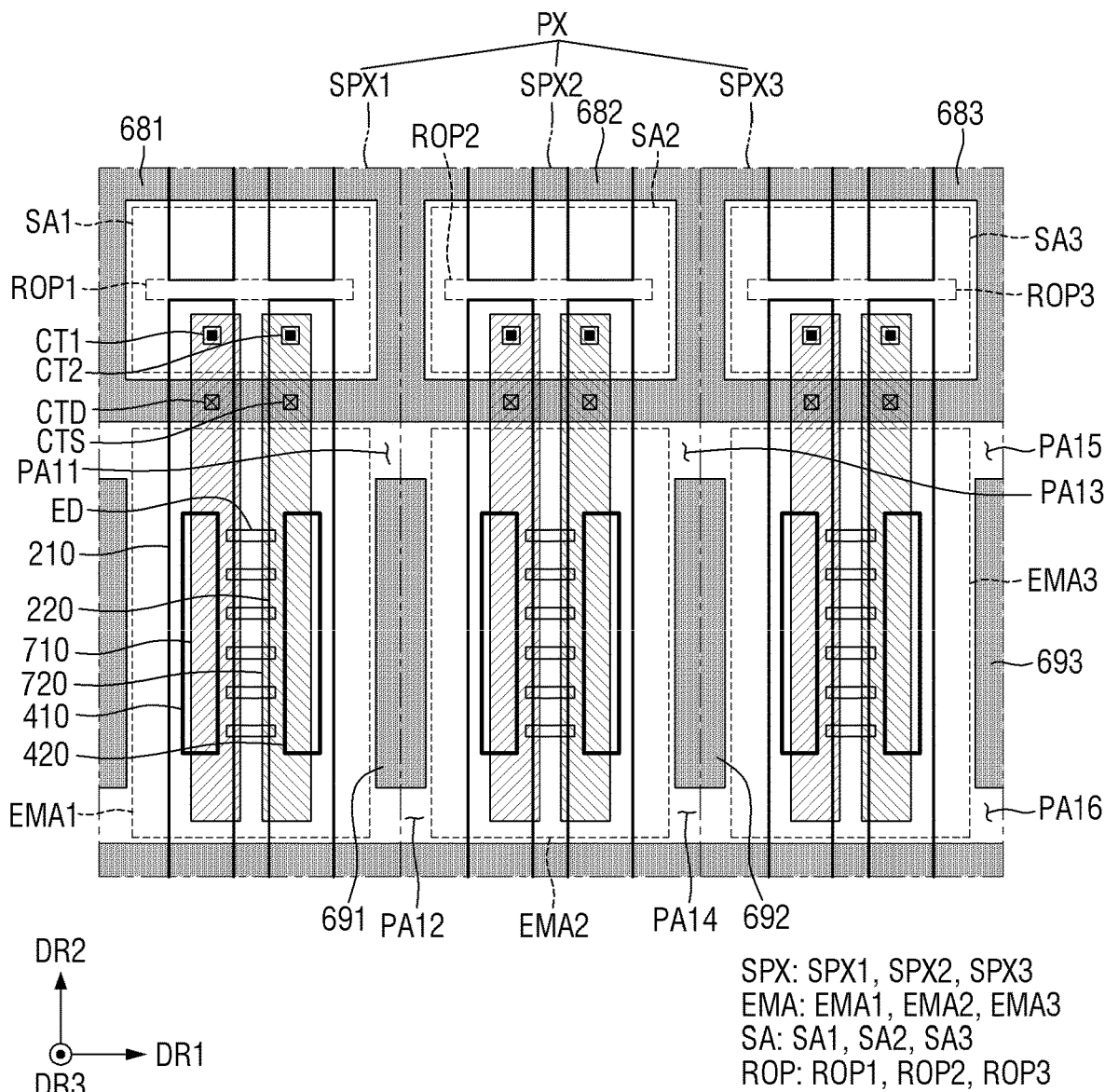
FIG. 18 is a schematic plan layout view of one pixel according to the embodiment shown in FIG. 17.

FIG. 17 is an enlarged view illustrating an example of a relative layout, in a plan view, of an emission area, a sub-area, and a first bank disposed in the area P3 of FIG. 16, and FIG. 18 is a schematic plan layout view of one pixel according to the embodiment shown in FIG. 17.

Referring to FIGS. 17 and 18, a first bank 600_5 may include a first pattern 680, an eighth wall 691, a ninth wall 692, and a tenth wall 693.

The first pattern 680 may be disposed to surround the sub-area SA of each sub-pixel SPX. For example, the first pattern 680 may include a first wall 681 surrounding the first sub-area SA1 of the first sub-pixel SPX1, a second wall 682 surrounding the second sub-area SA2 of the second sub-pixel SPX2, and a third wall 683 surrounding the third sub-area SA3 of the third sub-pixel SPX3. The first to third walls 681, 682, and 683 may be integrated and formed as one pattern. Accordingly, the first to third walls 681, 682, and 683 may not be physically apparent (e.g., physically apparent as separate structures).

The first pattern 680 may be disposed to surround the sub-area SA of each sub-pixel SPX as a wall to guide the ink so that the ink is not jetted to the sub-area SA during the inkjet process for aligning the light emitting elements ED from among the processes of manufacturing the display device 10.

The eighth wall 691 may be disposed at a boundary between the first emission area EMA1 and the second emission area EMA2. Widths of the first emission area EMA1 and the second emission area EMA2 in the second direction DR2 may be greater than a length of the eighth wall 691 in the second direction DR2. The eighth wall 691 may be disposed between the first emission area EMA1 and the second emission area EMA2 but may be spaced apart from the first pattern 680 in the second direction DR2.

Accordingly, passages PA11 and PA12 defined as areas between the eighth wall 691 and the first pattern 680 may be formed between the first emission area EMA1 and the second emission area EMA2.

The ninth wall 692 may be disposed at a boundary between the second emission area EMA2 and the third emission area EMA3. Widths of the second emission area EMA2 and the third emission area EMA3 in the second direction DR2 may be greater than a length of the ninth wall 692 in the second direction DR2. The ninth wall 692 may be disposed between the second emission area EMA2 and the third emission area EMA3 but may be spaced apart from the first pattern 680 in the second direction DR2. Accordingly, passages PA13 and PA14 defined as areas between the ninth wall 692 and the first pattern 680 may be formed between the second emission area EMA2 and the third emission area EMA3.

The tenth wall 693 may be disposed at a boundary between the third emission area EMA3 of one pixel PX and the first emission area EMA1 of another pixel PX disposed on the right side of the one pixel PX. A width of the first emission area EMA1 in the second direction DR2 and a width of the third emission area EMA3 in the second direction DR2 may be greater than a length of the tenth wall 693 in the second direction DR2. The tenth wall 693 may be disposed between the first emission area EMA1 and the third emission area EMA3 of the pixels PX neighboring in the first direction DR1 but may be spaced apart from the first pattern 680 in the second direction DR2. Accordingly, passages PA15 and PA16 defined as areas between the tenth wall 693 and the first pattern 680 may be formed between the third emission area EMA3 and the first emission area EMA1.

In an embodiment, even though the emission areas EMA of the respective sub-pixels SPX are arranged side-by-side along the first direction DR1, the eighth to tenth walls 691, 692, and 693 disposed in boundary areas between the emission areas EMA of the respective sub-pixels SPX are formed to be smaller than the widths of the emission areas EMA in the second direction DR2 such that the ink jetted into the emission areas EMA may flow to other emission areas EMA through the passages PA11, PA12, PA13, PA14, PA15, and PA16. When the emission areas EMA of the respective sub-pixels SPX are arranged side-by-side along the first direction DR1, a flow of the ink in an upward or downward direction may not be easier than when the emission areas EMA of the respective sub-pixels SPX are disposed adjacent to each other in a diagonal direction, but a design of the first bank 600-5 is easier, such that manufacturing process efficiency of the display device 10 may be improved.

Figure 19:
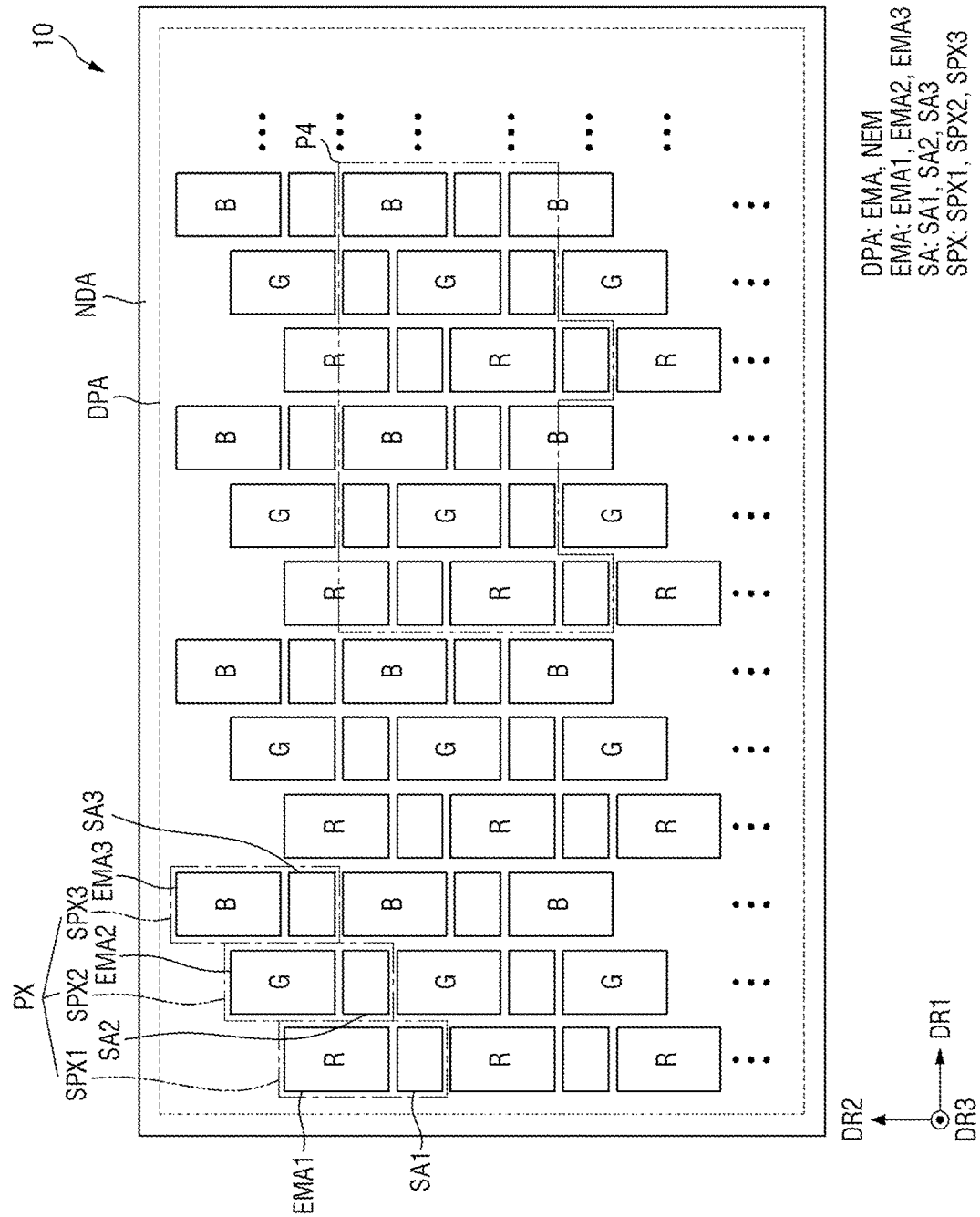
FIG. 19 is a schematic layout view illustrating a layout of emission areas and sub-areas of a display device according to an embodiment.

FIG. 19 is a schematic layout view illustrating a layout of emission areas and sub-areas of a display device according to an embodiment.

Referring to FIG. 19, this embodiment is different from the embodiment described above with reference to FIG. 2 in that directions in which emission areas EMA and sub-areas SA of a plurality of sub-pixels SPX included in one pixel PX are arranged are the same as each other.

Directions in which the sub-areas SA are disposed with respect to each of the emission areas EMA of first to third sub-pixels SPX1, SPX2, and SPX3 may be the same as each other. For example, the first to third sub-areas SA1, SA2, and SA3 may be disposed on the lower sides of the first to third emission areas EMA1, EMA2, and EMA3, respectively.

The first to third sub-pixels SPX1, SPX2, and SPX3 included in one pixel PX may be arranged in a diagonal direction. For example, the first to third sub-pixels SPX1, SPX2, and SPX3 may be arranged side-by-side in a direction toward the upper right side.

The first sub-area SA1 may be disposed on the lower side of the first emission area EMA1, and the second sub-area SA2 may be disposed on the right side of the first emission area EMA1. The second sub-area SA2 may be disposed on the right side of the first emission area EMA1, but a lower side of the second sub-area SA2 may be aligned with a lower side of the first emission area EMA1. The lower side of the second sub-area SA2 is aligned with the lower side of the first emission area EMA1, but a width of the second sub-area SA2 in the second direction DR2 is smaller than a width of the first emission area EMA1 in the second direction DR2 such that an upper area of the first emission area EMA1 and a lower area of the second emission area EMA2 in a plan view may overlap each other in the first direction DR1.

Similarly, the second sub-area SA2 may be disposed on the lower side of the second emission area EMA2, and the third sub-area SA3 may be disposed on the right side of the second emission area EMA2. The third sub-area SA3 may be disposed on the right side of the second emission area EMA2, but a lower side of the third sub-area SA3 may be aligned with a lower side of the second emission area EMA2. The lower side of the third sub-area SA3 is aligned with the lower side of the second emission area EMA2, but a width of the third sub-area SA3 in the second direction DR2 is smaller than a width of the second emission area EMA2 in the second direction DR2 such that an upper area of the second emission area EMA2 and a lower area of the third emission area EMA3 may overlap each other in the first direction DR1.

In addition, the first sub-area SA1 may be disposed on the left side of a second emission area EMA2 of another pixel PX disposed adjacent to one pixel PX on the lower side of the one pixel PX. An upper side of the first sub-area SA1 may be aligned with an upper side of the second emission area EMA2 of another pixel PX disposed adjacent to one pixel PX on the lower side of the one pixel PX. Similarly, the second sub-area SA2 may be disposed on the left side of a third emission area EMA3 of another pixel PX disposed adjacent to one pixel PX on the lower side of the one pixel PX. An upper side of the second sub-area SA2 may be aligned with an upper side of the third emission area EMA3 of another pixel PX disposed adjacent to one pixel PX on the lower side of the one pixel PX. The third sub-area SA3 may be disposed on the left side of a first emission area EMA1 of another pixel PX disposed adjacent to one pixel PX on the right side of the one pixel PX. An upper side of the third sub-area SA3 may be aligned with an upper side of the first emission area EMA1 of another pixel PX disposed adjacent to one pixel PX on the right side of the one pixel PX.

Figure 20:
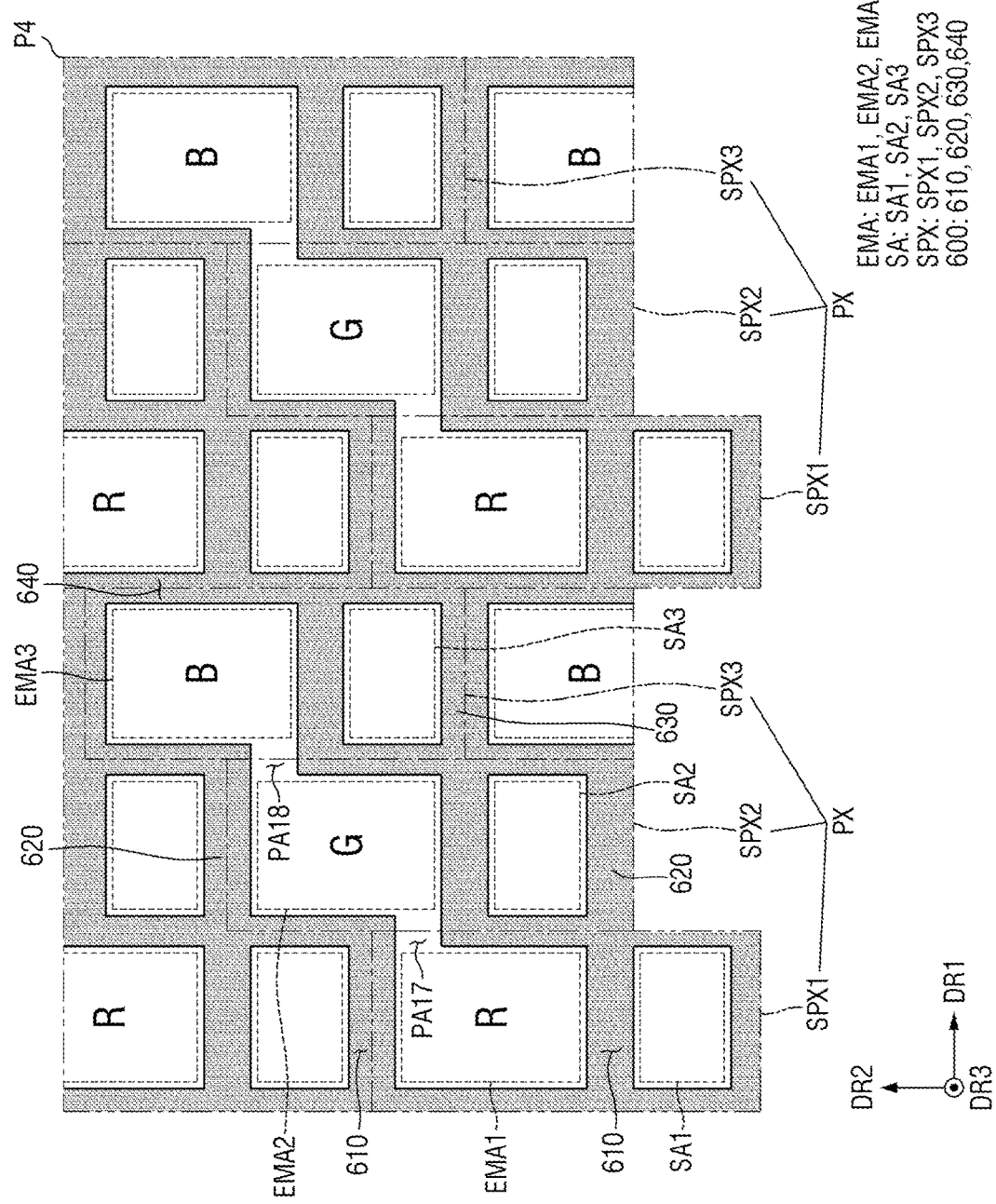
FIG. 20 is an enlarged view illustrating an example of a relative layout, in a plan view, of an emission area, a sub-area, and a first bank disposed in the area P4 of FIG. 19.
Figure 21:
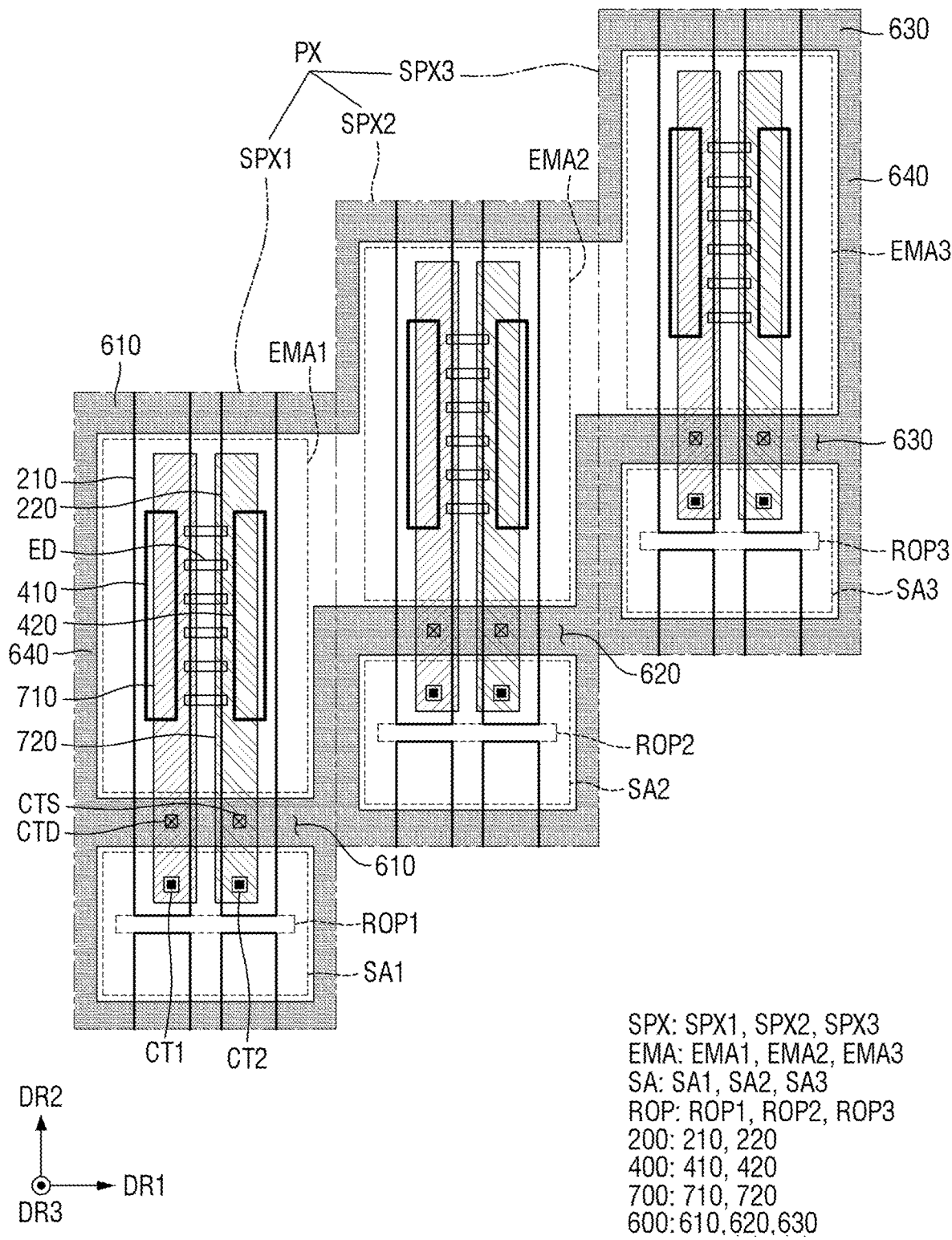
FIG. 21 is a schematic plan layout view of one pixel according to the embodiment shown in FIG. 20.

FIG. 20 is an enlarged view illustrating an example of a relative layout, in a plan view, of an emission area, a sub-area, and a first bank disposed in the area P4 of FIG. 19, and FIG. 21 is a schematic plan layout view of one pixel according to the embodiment shown FIG. 20.

Referring to FIGS. 20 and 21, a first bank 600 according to this embodiment may include first to fourth walls 610, 620, 630, and 640 integrated with each other to form one pattern (e.g., one continuous or integrated pattern).

The first bank 600 may be disposed to surround each emission area EMA, but to expose a portion of each emission area EMA.

The first wall 610 may be disposed to surround the first sub-area SA1, the second wall 620 may be disposed to surround the second sub-area SA2, and the third wall 630 may be disposed to surround the third sub-area SA3. The fourth wall 640 may be disposed at a boundary between the third emission area EMA3 of one pixel PX and the first emission area EMA1 of another pixel PX disposed on the right side of the one pixel PX. The fourth wall 640 may be disposed at the boundary between the third emission area EMA3 and the first emission area EMA1 to divide the third emission area EMA3 and the first emission area EMA1.

The first walls 610 may be disposed on the upper side and the lower side of the first emission area EMA1, respectively, the second wall 620 may be disposed on the right side of the first emission area EMA1, and the fourth wall 640 may be disposed on the left side of the first emission area EMA1. The first walls 610, the second wall 620, and the fourth wall 640 may be integrated to form one pattern. Accordingly, the first walls 610, the second wall 620, and the fourth wall 640 disposed adjacent to the first emission area EMA1 may not be physically apparent.

The second wall 620 disposed on the right side of the first emission area EMA1 may be spaced apart from the first wall 610 disposed on the upper side of the first emission area EMA1, in the second direction DR2. Accordingly, an upper area of the first emission area EMA1 may be exposed in the first direction DR1 by at least the second wall 620. A portion of the first emission area EMA1 exposed in the first direction DR1 by the second wall 620 may overlap a lower area of the second emission area EMA2 in the first direction DR1 to form a passage PA17. The passage PA17 may be defined as an area between the first wall 610 and the second wall 620 between the first emission area EMA1 and the second emission area EMA2.

The second walls 620 may be disposed on the upper side and the lower side of the second emission area EMA2, respectively, the third wall 630 may be disposed on the right side of the second emission area EMA2, and the first wall 610 (e.g., the first wall 610 disposed in another pixel PX adjacent to one pixel PX on the upper side of the one pixel PX) may be disposed on the left side of the second emission area EMA2. The second wall 620 disposed on the lower the second emission area EMA2 and the third wall 630 disposed on the right side of the second emission area EMA2 may be integrated and be not physically apparent, and the second wall 620 disposed on the upper side of the second emission area EMA2 and the first wall 610 disposed on the left side of the second emission area EMA2 may be integrated and be not physically apparent.

The third wall 630 disposed on the right side of the second emission area EMA2 may be spaced apart from the second wall 620 disposed on the upper side of the second emission area EMA2, in the second direction DR2. Accordingly, an upper area of the second emission area EMA2 may be exposed in the first direction DR1 by at least the third wall 630. A portion of the second emission area EMA2 exposed in the first direction DR1 by the third wall 630 may overlap a lower area of the third emission area EMA3 in the first direction DR1 to form a passage PA18. The passage PA18 may be defined as an area between the second wall 620 and the third wall 630 between the second emission area EMA2 and the third emission area EMA3.

The fourth wall 640 disposed on the right side of the third emission area EMA3 may be integrated with the third walls 630 each disposed on the upper side and the lower side of the third emission area EMA3 to form one pattern. Accordingly, the third walls 630, the second wall 620, and the fourth wall 640 disposed adjacent to the third emission area EMA3 may not be physically apparent.

In this embodiment, the first bank 600 may be disposed at a boundary between the respective pixels PX so as to one pixel PX to divide one pixel PX and another pixel PX. In addition, the first bank 600 may be formed so that the passages PA17 and PA18 defined by the first to third walls 610, 620, and 630 are formed between the first emission area EMA1, the second emission area EMA2, and the third emission area EMA3 arranged in the diagonal direction in one pixel PX. Accordingly, ink jetted into the respective emission areas EMA1, EMA2, and EMA3 may flow to the other emission areas EMA disposed in the diagonal direction through the passages PA17 and PA18. Accordingly, a surface shape of the ink jetted into the emission areas EMA may be flat at an upper side and an lower side of each emission area EMA, and the light emitting elements ED aligned in the process for aligning the light emitting elements ED may not be collected upward and downward in the emission areas EMA due to the shape of the ink.

In concluding the detailed description, those skilled in the art will appreciate that many variations and modifications can be made to the embodiments described herein without substantially departing from the aspects and features of the present disclosure. Therefore, the embodiments of the present disclosure described herein are used in a generic and descriptive sense and not for purposes of limitation.

What is claimed is:

1. A display device comprising:
a first sub-pixel having a first emission area and a first sub-area adjacent to each other in a first direction; and
a bank extending around a portion of the first emission area and the first sub-area, the bank comprising:
a first wall extending around the first sub-area; and
a second wall adjacent to the first emission area in a second direction, the second direction crossing the first direction, the second wall and the first wall being spaced apart from each other in the first direction.

2. The display device of claim 1, further comprising:
a first electrode and a second electrode over the first emission area and the first sub-area, extending in the first direction, and spaced apart from each other in the second direction; and
a plurality of light emitting elements between the first electrode and the second electrode in the first emission area.

3. The display device of claim 2, wherein the bank is on the first electrode and the second electrode.

4. The display device of claim 2, wherein the first electrode and the second electrode extend in the first direction in the first emission area and terminate in the first sub-area.

5. The display device of claim 1, wherein the bank comprises a hydrophobic material.

6. The display device of claim 1, further comprising a second sub-pixel adjacent to the first sub-pixel in the second direction, the second sub-pixel having a second emission area and a second sub-area adjacent to each other in the first direction,
wherein the second sub-area is spaced apart from the first emission area in the second direction with the second wall therebetween.

7. The display device of claim 6, wherein the second wall extends around the second sub-area.

8. The display device of claim 7, further comprising a third sub-pixel adjacent to the second sub-pixel in the second direction, the third sub-pixel having a third emission area and a third sub-area adjacent to each other in the first direction, wherein the third emission area is spaced apart from the second sub-area in the second direction with the second wall therebetween.

9. The display device of claim 8, wherein the bank further comprises a third wall extending around the third sub-area, and
wherein the third wall and the second wall are spaced apart from each other in the first direction.

10. The display device of claim 9, wherein the second emission area is spaced apart from the first sub-area in the second direction with the first wall therebetween and is spaced apart from the third sub-area in the second direction with the third wall therebetween.

11. The display device of claim 1, further comprising a second sub-pixel adjacent to the first sub-pixel in the second direction, the second sub-pixel having a second emission area and a second sub-area adjacent to each other in the first direction,
wherein the second emission area is spaced apart from the first emission area in the second direction with the second wall therebetween.

12. The display device of claim 11, wherein the second sub-area is adjacent to the first sub-area in the second direction, and
the bank further comprises a third wall extending around the second sub-area.

13. The display device of claim 12, wherein the first wall and the third wall are integrated with each other to form one pattern.

14. The display device of claim 12, wherein the second wall and the third wall are spaced apart from each other in the first direction.

15. The display device of claim 1, further comprising a second sub-pixel adjacent to the first sub-pixel in the first direction, the second sub-pixel having a second emission area and a second sub-area adjacent to each other in the first direction,
wherein the bank further comprises a third wall extending around the second sub-area, a distance between the first wall and the third wall in the first direction being greater than a length of the second wall in the first direction.

16. The display device of claim 15, wherein an interval between the first wall and the second wall in the first direction is smaller than the length of the second wall in the first direction.

17. A display device comprising:
a first emission area;
a first sub-area on one side of the first emission area in a first direction;
a second sub-area on another side of the first emission area in the first direction;
a third sub-area on one side of the first emission area in a second direction crossing the first direction;
a first wall extending around the first sub-area;
a second wall extending around the second sub-area; and
a third wall extending around the third sub-area,
wherein the third wall is spaced apart from the second wall in the first direction and is integrated with the first wall.

18. The display device of claim 17, further comprising:
a first electrode and a second electrode over the first emission area, the first sub-area, and the second sub-area, extending in the first direction, and spaced apart from each other in the second direction; and
a plurality of light emitting elements between the first electrode and the second electrode in the first emission area.

19. The display device of claim 18, wherein the first electrode and the second electrode extend in the first direction in the first emission area and terminate in the first sub-area and the second sub-area.

20. The display device of claim 17, further comprising a second emission area on another side of the third sub-area in the first direction,
wherein the second emission area is on one side of the second sub-area in the second direction, and
a passage defined as an area between the second wall and the third wall is formed between the first emission area and the second emission area.

* * * * *